US009977844B2

(12) United States Patent
Jovanovic

(10) Patent No.: US 9,977,844 B2
(45) Date of Patent: *May 22, 2018

(54) METHOD FOR PROVIDING A PROJECTION TO ALIGN 3D OBJECTS IN 2D ENVIRONMENT

(71) Applicant: Atheer, Inc., Mountain View, CA (US)

(72) Inventor: Milos Jovanovic, Portland, OR (US)

(73) Assignee: Atheer, Inc., Mountain View, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/710,560

(22) Filed: May 12, 2015

(65) Prior Publication Data

US 2015/0332508 A1 Nov. 19, 2015

Related U.S. Application Data

(60) Provisional application No. 61/992,629, filed on May 13, 2014, provisional application No. 61/992,759, (Continued)

(51) Int. Cl.
*G06T 19/00* (2011.01)
*G06F 3/0488* (2013.01)
(Continued)

(52) U.S. Cl.
CPC ............ *G06F 17/50* (2013.01); *G06F 3/0486* (2013.01); *G06F 3/0488* (2013.01); *G06F 3/04815* (2013.01); *G06F 3/04845* (2013.01); *G06F 17/5004* (2013.01); *G06T 13/205* (2013.01); *G06T 15/10* (2013.01); *G06T 15/20* (2013.01); *G06T 19/006* (2013.01); *G06T 19/20* (2013.01); *G06F 2203/04802* (2013.01); *G06T 2215/12* (2013.01); *G06T 2215/16* (2013.01); *G06T 2219/004* (2013.01); *G06T 2219/008* (2013.01); *G06T 2219/012* (2013.01); *G06T 2219/2004* (2013.01); *G06T 2219/2008* (2013.01);
(Continued)

(58) Field of Classification Search
USPC .................................. 345/419, 427
See application file for complete search history.

(56) References Cited

U.S. PATENT DOCUMENTS 6,532,021 B1 * 3/2003 Tognazzini ........ G02B 27/2264
345/629
6,771,276 B1 8/2004 Highsmith et al.
(Continued)

*Primary Examiner* — Kimbinh T Nguyen
(74) *Attorney, Agent, or Firm* — McCoy Russell LLP

(57) ABSTRACT

Example systems and methods for virtual visualization of a three-dimensional (3D) model of an object in a two-dimensional (2D) environment. The method may include projecting a planar projection from the 3D model while positioning the 3D model within the 2D environment. In one aspect, the method may include aligning a first 3D object and a second 3D object in the 2D environment about an alignment axis by selecting the alignment axis, generating a plane projection along the alignment axis from the first object, and positioning the second object corresponding to the plane projection. In another aspect, the method may comprise projecting an elevated 3D object wherein the projection may be demonstrated as crosshairs, such that crosshairs on the ground plane may be used for placing the second 3D object in the 2D environment.

20 Claims, 12 Drawing Sheets

Related U.S. Application Data filed on May 13, 2014, provisional application No. 61/992,719, filed on May 13, 2014, provisional application No. 61/992,774, filed on May 13, 2014, provisional application No. 61/992,746, filed on May 13, 2014, provisional application No. 61/992,665, filed on May 13, 2014.

(51) Int. Cl.

| | | |
|---|---|---|
| *G06F 17/50* | (2006.01) | |
| *G06F 3/0486* | (2013.01) | |
| *G06T 15/10* | (2011.01) | |
| *G06F 3/0484* | (2013.01) | |
| *G06F 3/0481* | (2013.01) | |
| *G06T 13/20* | (2011.01) | |
| *G06T 19/20* | (2011.01) | |
| *G06T 15/20* | (2011.01) | |

(52) U.S. Cl.
CPC .............. *G06T 2219/2012* (2013.01); *G06T 2219/2016* (2013.01); *G06T 2219/2024* (2013.01)

(56) References Cited

U.S. PATENT DOCUMENTS

| | | | |
|---|---|---|---|
| 6,809,745 B1 | 10/2004 | O'Donnell et al. | |
| 6,891,533 B1 | 5/2005 | Alcorn et al. | |
| 6,912,293 B1 | 6/2005 | Korobkin | |
| 7,043,695 B2* | 5/2006 | Elber .................. G06T 17/00 | |
| | | | 345/418 |
| 7,062,722 B1 | 6/2006 | Carlin et al. | |
| 7,277,572 B2 | 10/2007 | MacInnes et al. | |
| 7,425,958 B2 | 9/2008 | Berger et al. | |
| 7,523,411 B2 | 4/2009 | Carlin | |
| 7,583,275 B2 | 9/2009 | Neumann et al. | |
| 8,099,237 B2 | 1/2012 | Mays et al. | |
| 8,935,328 B2 | 1/2015 | Tumuluri | |
| 9,092,053 B2 | 7/2015 | Kerr et al. | |
| 9,129,433 B1* | 9/2015 | Korobkin ............ G06T 15/20 | |
| 9,317,959 B2 | 4/2016 | Densham | |
| 9,317,962 B2 | 4/2016 | Morato et al. | |
| 9,330,503 B2 | 5/2016 | Mital et al. | |
| 9,514,573 B2 | 12/2016 | Grimaud | |
| 9,659,406 B2 | 5/2017 | Arcas et al. | |
| 2004/0105573 A1 | 6/2004 | Neumann et al. | |
| 2005/0002662 A1 | 1/2005 | Arpa et al. | |
| 2007/0098290 A1 | 5/2007 | Wells | |
| 2007/0124215 A1 | 5/2007 | Simmons, Jr. | |
| 2008/0222503 A1 | 9/2008 | Sandige et al. | |
| 2009/0113349 A1 | 4/2009 | Zohar et al. | |
| 2009/0125801 A1 | 5/2009 | Algreatly | |
| 2009/0243957 A1 | 10/2009 | Ni et al. | |
| 2009/0254843 A1 | 10/2009 | Van Wie et al. | |
| 2010/0001992 A1 | 1/2010 | Schultz et al. | |
| 2010/0188397 A1 | 7/2010 | Tsai et al. | |
| 2010/0194863 A1 | 8/2010 | Lopes et al. | |
| 2010/0208033 A1 | 8/2010 | Edge et al. | |
| 2010/0208057 A1 | 8/2010 | Meier et al. | |
| 2010/0289817 A1 | 11/2010 | Meier et al. | |
| 2011/0188760 A1 | 8/2011 | Wright et al. | |
| 2012/0070101 A1 | 3/2012 | Kogan et al. | |
| 2012/0086727 A1 | 4/2012 | Korah et al. | |
| 2012/0120113 A1* | 5/2012 | Hueso .................. G06F 3/011 | |
| | | | 345/672 |
| 2012/0169847 A1 | 7/2012 | Lee et al. | |
| 2012/0183204 A1 | 7/2012 | Aarts et al. | |
| 2013/0002649 A1 | 1/2013 | Wu et al. | |
| 2013/0135303 A1 | 5/2013 | Densham | |
| 2013/0187905 A1 | 7/2013 | Vaddadi et al. | |
| 2013/0212538 A1 | 8/2013 | Lemire et al. | |
| 2013/0326583 A1* | 12/2013 | Freihold ............. G06F 3/04815 | |
| | | | 726/3 |
| 2014/0104315 A1 | 4/2014 | Kapler et al. | |
| 2014/0176537 A1 | 6/2014 | Densham | |
| 2015/0049086 A1 | 2/2015 | Morato et al. | |
| 2015/0062125 A1 | 3/2015 | Aguilera Perez et al. | |
| 2015/0170260 A1* | 6/2015 | Lees .................. G06Q 30/0643 | |
| | | | 705/27.2 |
| 2015/0310662 A1 | 10/2015 | Arcas et al. | |
| 2015/0332504 A1 | 11/2015 | Wang et al. | |
| 2015/0332505 A1 | 11/2015 | Wang et al. | |

\* cited by examiner

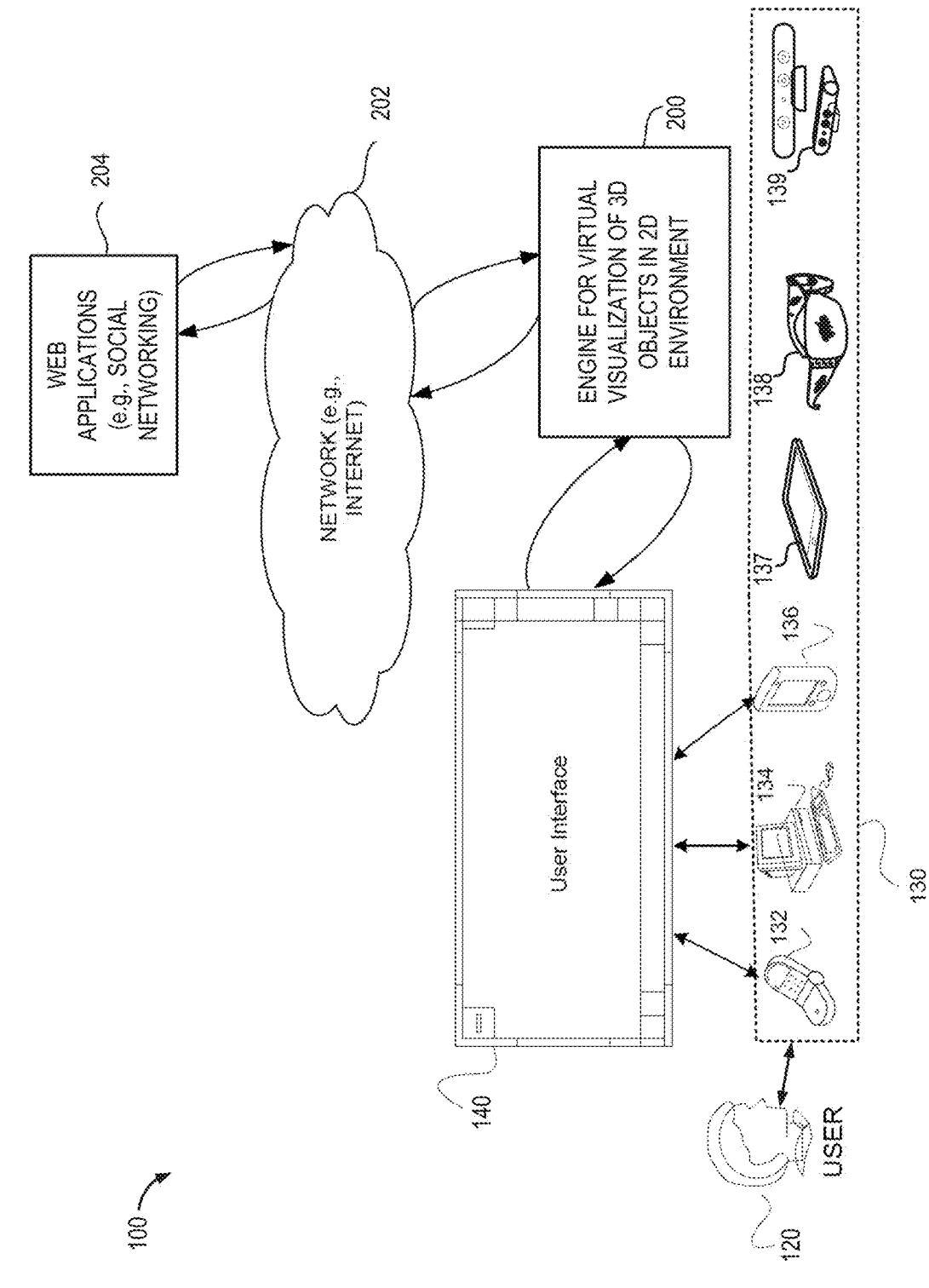

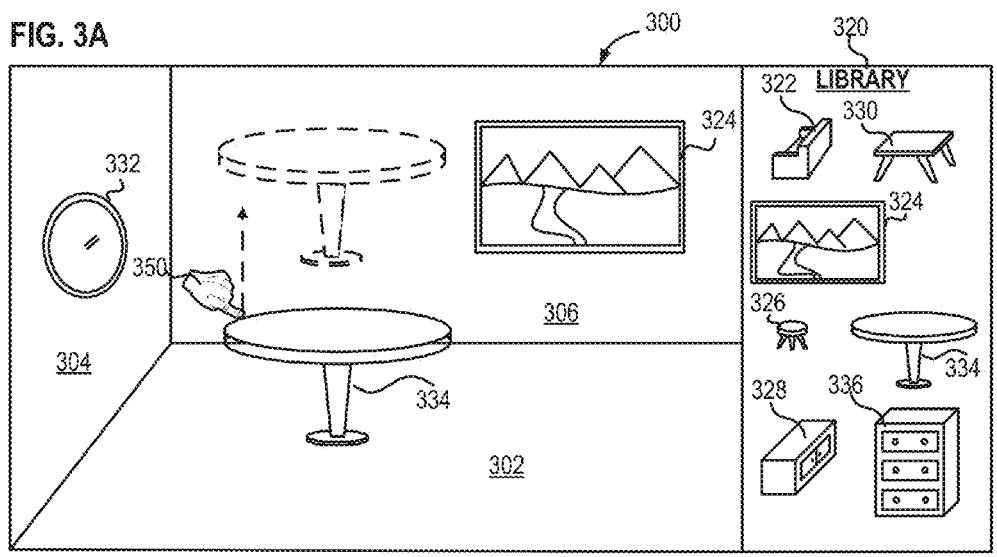
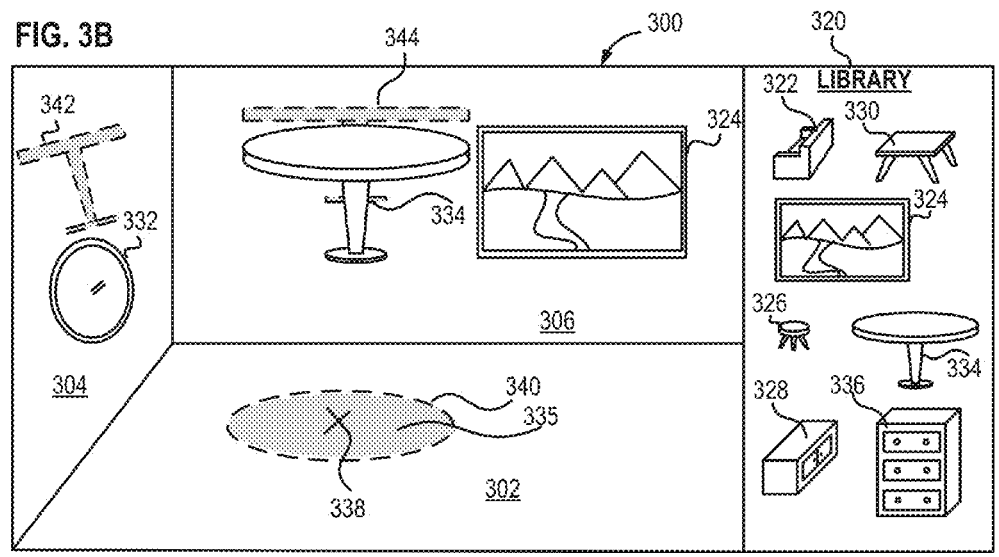

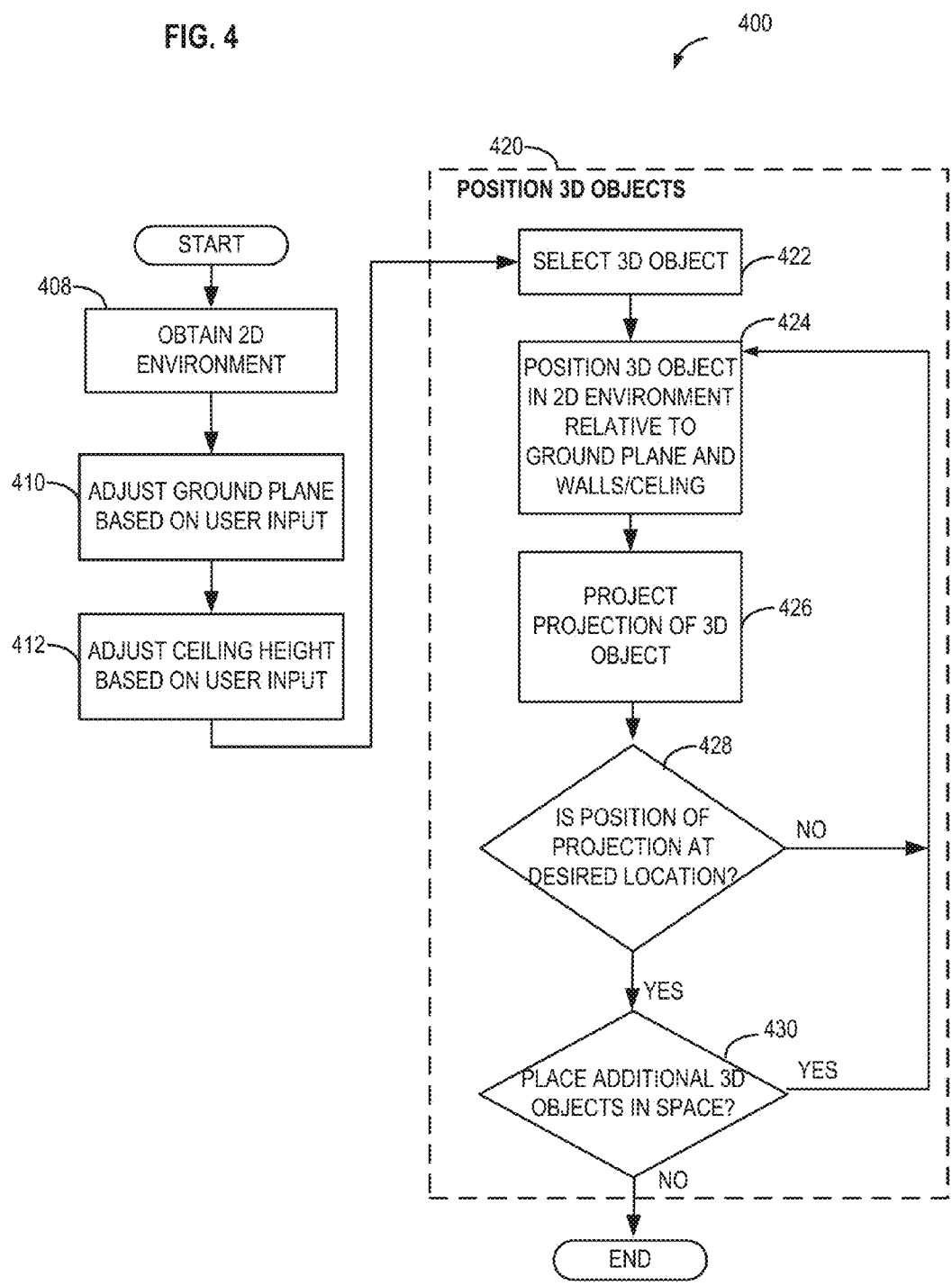

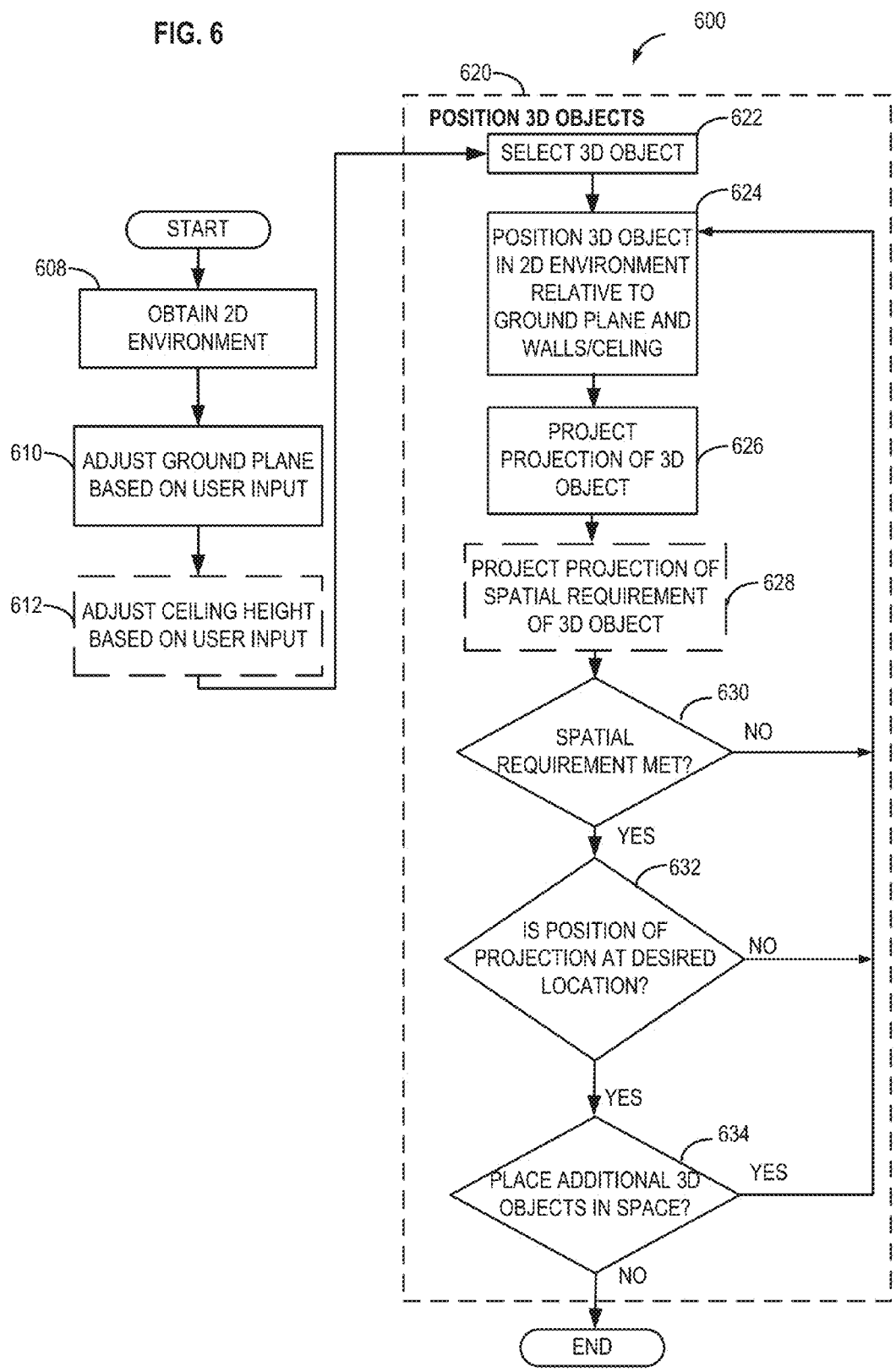

METHOD FOR PROVIDING A PROJECTION TO ALIGN 3D OBJECTS IN 2D ENVIRONMENT

CROSS-REFERENCE TO RELATED APPLICATIONS

The present application claims priority to U.S. Provisional Patent Application No. 61/992,759 entitled "METHOD FOR FORMING WALLS TO ALIGN 3D OBJECTS IN 2D ENVIRONMENT", filed on May 13, 2014, the entire contents of which are hereby incorporated by reference for all purposes. The present application also claims priority to U.S. Provisional Patent Application No. 61/992,629 entitled "METHOD FOR PROVIDING SCALE TO ALIGN 3D OBJECTS IN 2D ENVIRONMENT", filed on May 13, 2014, the entire contents of which are hereby incorporated by reference for all purposes. The present application claims further priority to U.S. Provisional Patent Application No. 61/992,719 entitled "METHOD FOR PROVIDING A PROJECTION TO ALIGN 3D OBJECTS IN 2D ENVIRONMENT", filed May 13, 2014, the entire contents of which are hereby incorporated by reference for all purposes. The present application claims further priority to U.S. Provisional Patent Application No. 61/992,774 entitled "METHOD FOR MOVING AND ALIGNING 3D OBJECTS IN A PLANE WITHIN THE 2D ENVIRONMENT", filed May 13, 2014, the entire contents of which are hereby incorporated by reference for all purposes. The present application claims further priority to U.S. Provisional Patent Application No. 61/992,746 entitled "METHOD FOR REPLACING 3D OBJECTS IN 2D ENVIRONMENT", filed May 13, 2014, the entire contents of which are hereby incorporated by reference for all purposes. The present application claims further priority to U.S. Provisional Patent Application No. 61/992,665 entitled "METHOD FOR INTERACTIVE CATALOG FOR 3D OBJECTS WITHIN THE 2D ENVIRONMENT", filed May 13, 2014, the entire contents of which are hereby incorporated by reference for all purposes.

BACKGROUND AND SUMMARY

Interior design may involve developing and evaluating a design for a room or environment. For example, a designer may wish to position various objects, including furniture, lighting fixtures, and wall hangings, within a two-dimensional (2D) environment of an interior room. Conventional interior design tools may enable a user to position a three-dimensional (3D) model of an object by selecting the object, and "dragging and dropping" the object to a location in the 2D environment using a mouse, keyboard or other input device.

The inventors herein have recognized various issues with the above methods. Namely, although 3D objects may be positioned independently within the 2D environment, it may be difficult to precisely align the 3D object relative to other objects already present in the 2D environment. For example, a user may want to place a table underneath and in vertical alignment with a light fixture. Using conventional methods, a user can manually position an object to be in alignment with another object; however, manually aligning objects may be time-consuming and imprecise.

One approach that at least partially address the above issues may include a method for placing the 3D model of the object in the 2D environment, comprising projecting a projection from the 3D object while positioning the 3D object within the 2D environment.

In another embodiment, a method for placing 3D models of objects in the 2D environment may comprise placing the 3D object along a plane at a first position, moving the 3D object away from the first position along an axis perpendicular to the plane, and projecting a planar target or planar shadow of the 3D object on the plane about the axis. In projecting the planar target about the axis, the perpendicular axis passes through the center of the 3D object to the center of the planar target projected on the plane.

In another embodiment, a method of aligning a first 3D object and a second 3D object in the 2D environment about an alignment axis may comprise selecting the alignment axis, generating a planar projection along the alignment axis from the first 3D object, and positioning the second 3D object corresponding to the planar projection.

In another embodiment, a method may comprise projecting an elevated 3D object wherein the projection may be demonstrated as crosshairs. The crosshairs on the ground plane may be used for placing another 3D object in the 2D environment.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 1A is a block diagram illustrating the overall system for visualization of a 3D model of an object in a 2D environment, in accordance with various embodiments.

FIGS. 3A, 3B, 3C and 3D are example representations of a 2D environment with 3D objects.

FIG. 4 is an example flowchart for a method of placing 3D objects in the 2D environment.

FIG. 6 is an example flow chart for another method of placing 3D objects in the 2D environment.

DETAILED DESCRIPTION

Figure 1B:
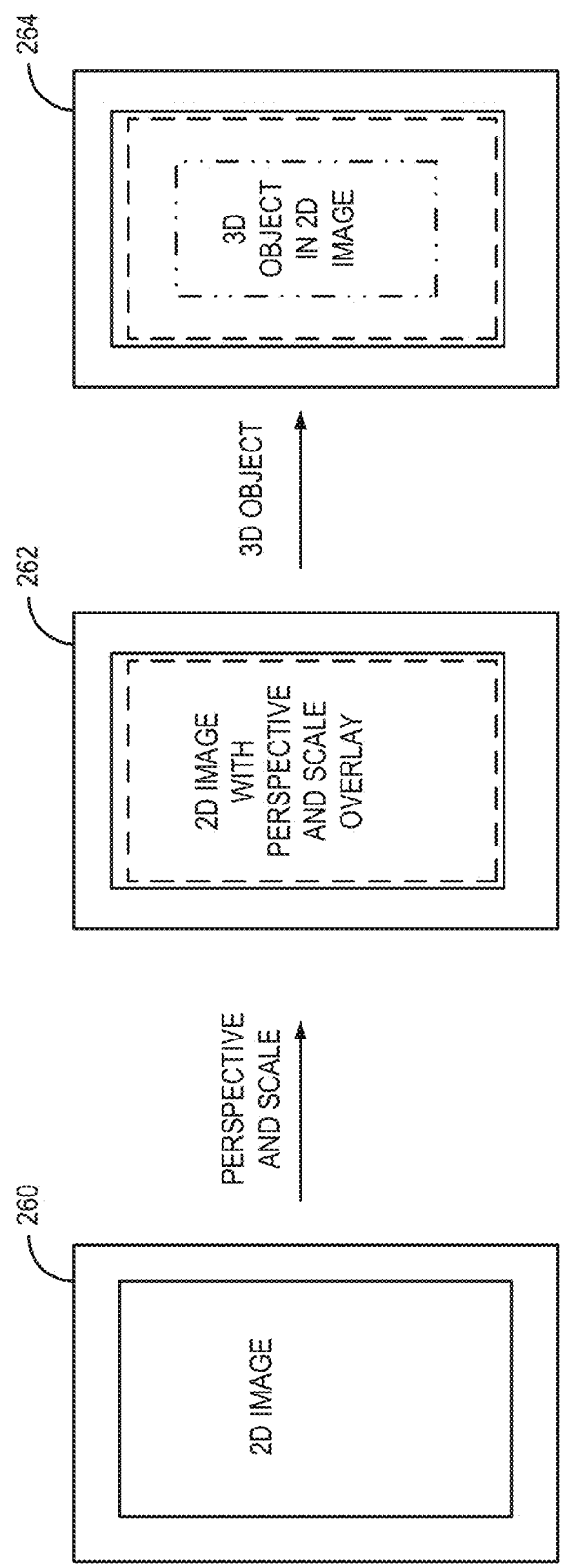
FIG. 1B is a schematic illustration of a system for visualization of 3D model of objects in a 2D environment.

The present description relates to visualization and adding of 3D models of objects to a 2D environment, wherein the 2D environment is a real environment represented by a photo or video. A user may import photographic images, digital images, video images, and other graphical representations of the 2D environment. Further, the 2D environment may include existing graphical materials or graphical materials captured as a still image or a live feed image. The 2D environment may serve as the background environment for adding a 3D model of an object.

The 3D object is associated with object information data which includes a defined set of parameters relevant to the 3D object. The parameters may include attributes, instructions, and other such scripts associated and essential for graphical use of the 3D object. Physical properties of the 3D object, interaction between object entities may be analyzed with such associated data. The object information data associated with the 3D object may include geometric attributes, depth value, color value, and such other properties. For example, geometric attributes of the 3D object, such as a chair, may include height and width information. If a user decides to place the chair near a table, already present in the 2D environment, the height and width information for the chair may help the user in precise aligning.

The object information data may also include metadata encoding one or more of a set of parameters relevant to the 3D object, manufacturer's guidelines, regulations and guidelines governing the 3D object, safety guidelines for the 3D object, and any other relevant information specific to the 3D object.

The object information data may include metadata defining the behavior of the 3D object within the 2D environment. For example, a 3D object may include metadata defining an object as one of a wall object, ceiling object, floor object, or combination thereof. The metadata may further define the placement and movement of the object within the environment.

The object information data may also include metadata encoding an information tag. The information tag may include a description of the 3D object including dimensions, materials, cost, manufacturer, and other information specific to the 3D object discussed below.

The object information data may also include metadata encoding graphical data, spatial data, and other rendering data for superimposing the 3D object within the 2D environment. Graphical, spatial, and rendering data may be processed by a computing device to generate and display the 3D object to the user.

The parameters may include attributes, instructions, behavior characteristics, visualizations to be displayed by the 3D object, and other such scripts associated and essential for graphical use of the 3D object. For example, the parameters may include, but are not limited to, the physical dimensions of the 3D object, mounting requirements for the 3D object, metadata identifying the 3D object as a floor object, wall object, ceiling object, or combination thereof, power requirements, length of a power cord, and any other relevant information describing the 3D object.

Additionally, the object information data may include additional parameters such as manufacturer's guidelines and/or safety guidelines for safe and proper installation and operation of the 3D object. For example, the object information data may include metadata encoding a minimum clearance or spatial requirement surrounding the 3D object. The minimum clearance/spatial requirement may be required for adequate ventilation of the 3D object, prevention of fire hazards, noise control, clearance of moving parts of the 3D object, or to satisfy any other personal safety, medical safety, or industrial safety standard. As an example, a display may require 6 inches clear from the cooling fan gratings to allow for proper airflow to cool the electric internals within the display. As another example, in a medical application, a magnetic resonance imager may generate an electro-magnetic field in an area surrounding the magnetic resonance imager that may interfere with other electrically powered or magnetically sensitive medical equipment, personal medical equipment such as a pacemaker, and any magnetic material that may be drawn to the magnetic resonance imager by magnetic attraction. In an industrial application, some industrial equipment have moving or rotating parts that may extend past the main body of the piece of industrial equipment. Therefore, to allow for proper operation of the industrial equipment, other equipment or objects may be located outside a minimum clearance or spatial requirement surrounding the piece of industrial equipment.

In another example, in a restaurant environment, the tables, chairs, and other objects within the restaurant space may be required to be arranged such that a minimum clearance surrounding each object is maintained and that pathways for traversal are maintained clear and of sufficient dimensions to meet federal and local accommodation codes. Therefore, each chair and each table may include a minimum clearance or spatial requirement surrounding the table or chair to meet the governing guidelines.

In another example, in a retail environment, retail display fixtures may be arranged within the retail space such that a minimum clearance surrounding each fixture may be maintained to allow shoppers to easily move within the retail space and to meet federal and local accommodation codes. In addition to satisfaction of the governing access codes, the 3D models of the display fixtures and accompanying merchandise may be arranged within the 2D image of the retail space allowing retail planners to efficiently design retail merchandising plans, design retail exhibit plans, and then electronically distribute the design plans to the stores. Further, the retail merchandising teams at the stores may propose amendments to the design plans that are specific to the available retail space within the store accounting for differences due to the specific architectural design of the store space. These amendments may then be reviewed and approved by the retail planners, thereby providing an advantage of an efficient and electronic means of distributing, amending, and approving retail merchandising plans.

The object information data may be provided by multiple sources, including but not limited to, one or more of the manufacturer of the 3D object, government safety regulations such as provided by the Occupational Safety and Health Administration or other Federal or local governing body, federal and local accommodation codes such as the Americans with Disabilities Act and federal, state, and local fire codes, the user may provide the object information data, object information data may be downloaded from a remote data base, encoded by an asset manager or managing service providing the 3D objects, or any other suitable means. It will be appreciated that the listed sources of object information data are not intended to be limiting.

In some embodiments, the object information data may include one or more spatial requirements. The spatial requirements may exceed the geometric dimensions of the 3D object and govern interactions between the 3D object and other object entities. The spatial requirements of a 3D object may be specific to the object based upon one or more of a manufacturer's recommendation, imported from a remote database, government regulation, configured by the user, or any other suitable source.

In some embodiments, the two-dimensional environment may also include environmental information data. The environmental information data may include metadata which may encode one or more of a set of properties relevant to the 2D environment, regulations and guidelines governing the 2D environment such as governing access regulations, industrial safety standards, and governing fire codes, safety guidelines for the 2D environment, and any other relevant information specific to the 2D environment. The properties encoded by environmental information data may include one or more of the dimensions of the 2D environment, characteristics of the 2D environment governing the behavior and movement of 3D objects within the 2D environment, locations of power supplies and the voltage and frequency supplied, construction information such as location of load bearing members, allowable load information, construction materials, available ventilation, acoustic information, fixed lighting sources, and any other information relevant to the two-dimensional environment.

The environmental information data may be provided by multiple sources such as one or more of government safety regulations such as provided by the Occupational Safety and Health Administration or other Federal or local governing body, federal and local accommodation codes such as the Americans with Disabilities Act and federal, state, and local fire codes, the user may provide the object information data, object information data may be downloaded from a remote data base, encoded by an asset manager or managing service providing the 3D objects, or any other suitable means.

In these embodiments properties of the 2D environment may be retrieved from the environmental information data and analyzed to determine interaction with 3D objects within the 2D environment. As a non-limiting example, one or more threshold barriers between two planes of the 2D environment may be adjusted to satisfy one or more conditions encoded in the metadata of both the environmental information data and the object information data.

In some embodiments, the physical properties of the 3D object, interaction between object entities, and interactions between object entities and the 2D environment may be analyzed with such associated data.

As the data associated with the 3D object is transferred to the 2D environment, the 3D object may be visualized in the 2D environment with respect to scale and perspective of the 2D environment. The 2D environment including the 3D object may be referred to as a modeled 2D environment. Within the 2D environment, the user may move the 3D object in a vertical direction, horizontal direction, or in a rotational manner. For example, if the 3D object is a display, the user may move the display in a vertical or horizontal manner on a wall plane of the 2D environment; whereas, if the 3D object is a chair on a ground plane of the 2D environment, the user may move the chair in a horizontal or rotational manner.

Within the 2D environment, the user may also generate a projection of the 3D object on a surface in the 2D environment, where the surface may be a horizontal plane such as a floor plane or ceiling plane or top plane, a vertical plane such as a wall plane, an inclined plane such as a ceiling plane, floor plane, or wall plane, a curved surface or another such plane. The projection thus formed may be used as a guide to move, adjust, and align the 3D object in the 2D environment in accordance to the user's preference, relative to other objects in the 2D environment. Further, the user may insert an additional 3D object onto the 2D environment. The projection from the previously added 3D object may be used as a guide by the user to align and adjust the additionally added 3D object. In some embodiments, the projection may be vertically displaced from the object but not horizontally displaced.

The user may save the resulting image to a personal computer (PC) or network database for future use or reference, or post the resulting image on a social network, and perform other operations on the image. Further, the user may have some previously saved images which the user may use to compare with the newly obtained images in order to select preferable combinations of a 3D object in a 2D background. The user may use his preferences before purchasing one or more 3D object for the 2D environment.

Additionally, the user may be connected to various social networking services and/or microblogs, such as Facebook™, Twitter™, and other such networking services. Connection to social networking services and/or microblogs may allow user to interact with his contacts to share and obtain opinion and feedback on image obtained after placing 3D objects in 2D environment. Further, the user may also request help from designing services to arrange 3D objects within a given 2D environment.

Visualization and addition of 3D objects to any 2D environment provides ample opportunities in various spheres of human life. Spatial representation of 3D objects may help in comprehending and learning, designing and drafting, efficient space management, and accelerated decision making and planning. The ability to represent virtual 3D objects in a real environment can provide further applications, such as selecting furniture for a house, designing kitchen cabinets, selecting display and presentation equipment for conference rooms, presentation layouts for tradeshow booths, industrial planning and industrial equipment placement, medical equipment placement, and other space and design applications.

Figure 2:
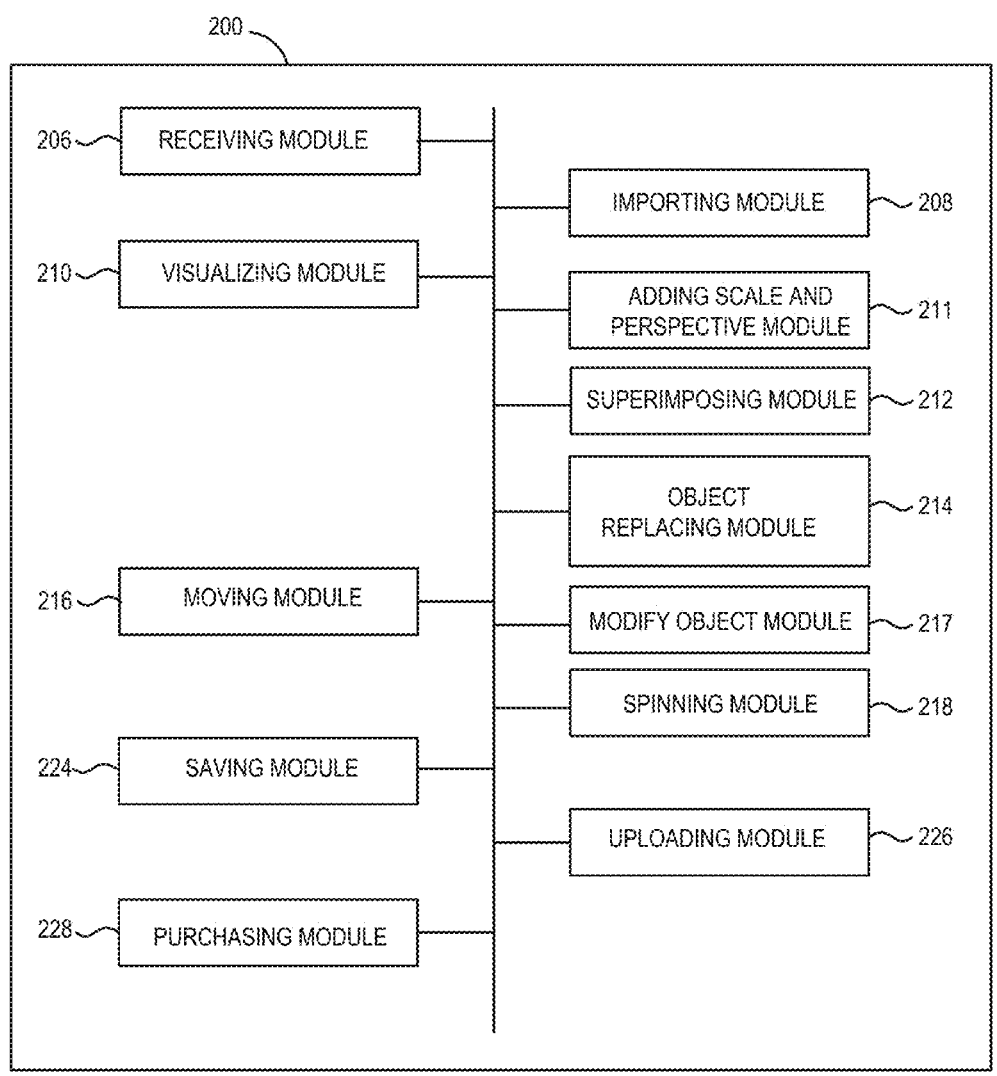
FIG. 2 is a block diagram showing various modules of an engine for visualization of 3D objects in the 2D environment, in accordance with various embodiments.
Figure 5A:
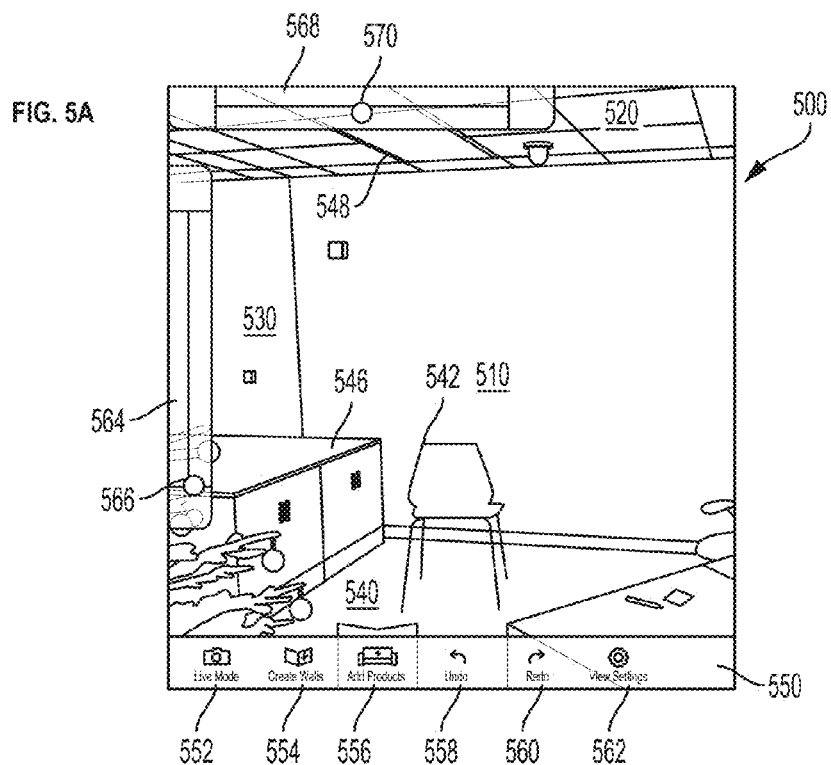
FIGS. 5A and 5B are example representations of another 2D environment
Figure 5B:
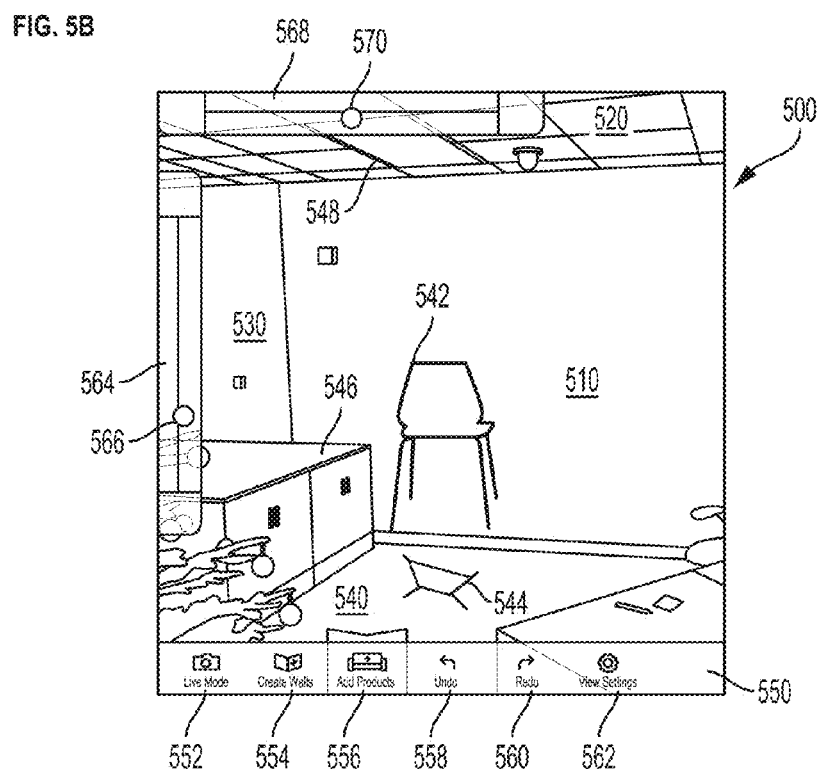
Figure 5C:
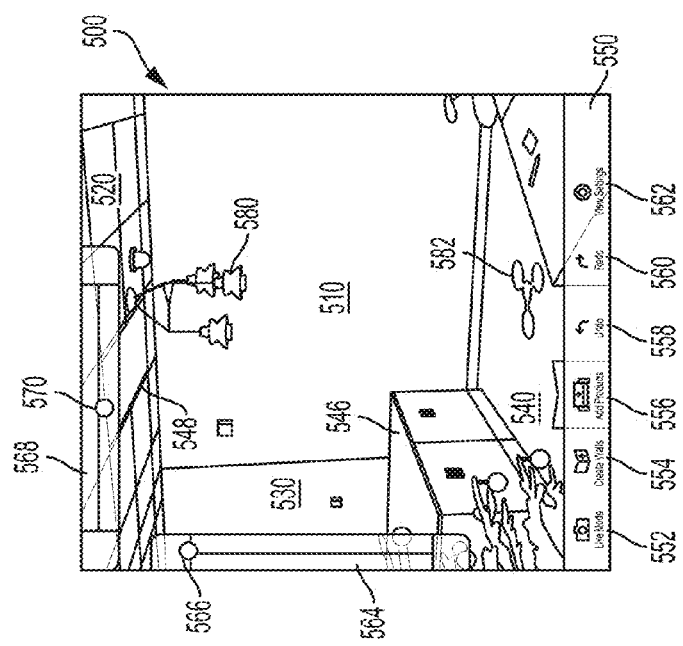
FIGS. 5C and 5D are further example representations of the 2D environment illustrated in FIGS. 5A and 5B.
Figure 5D:
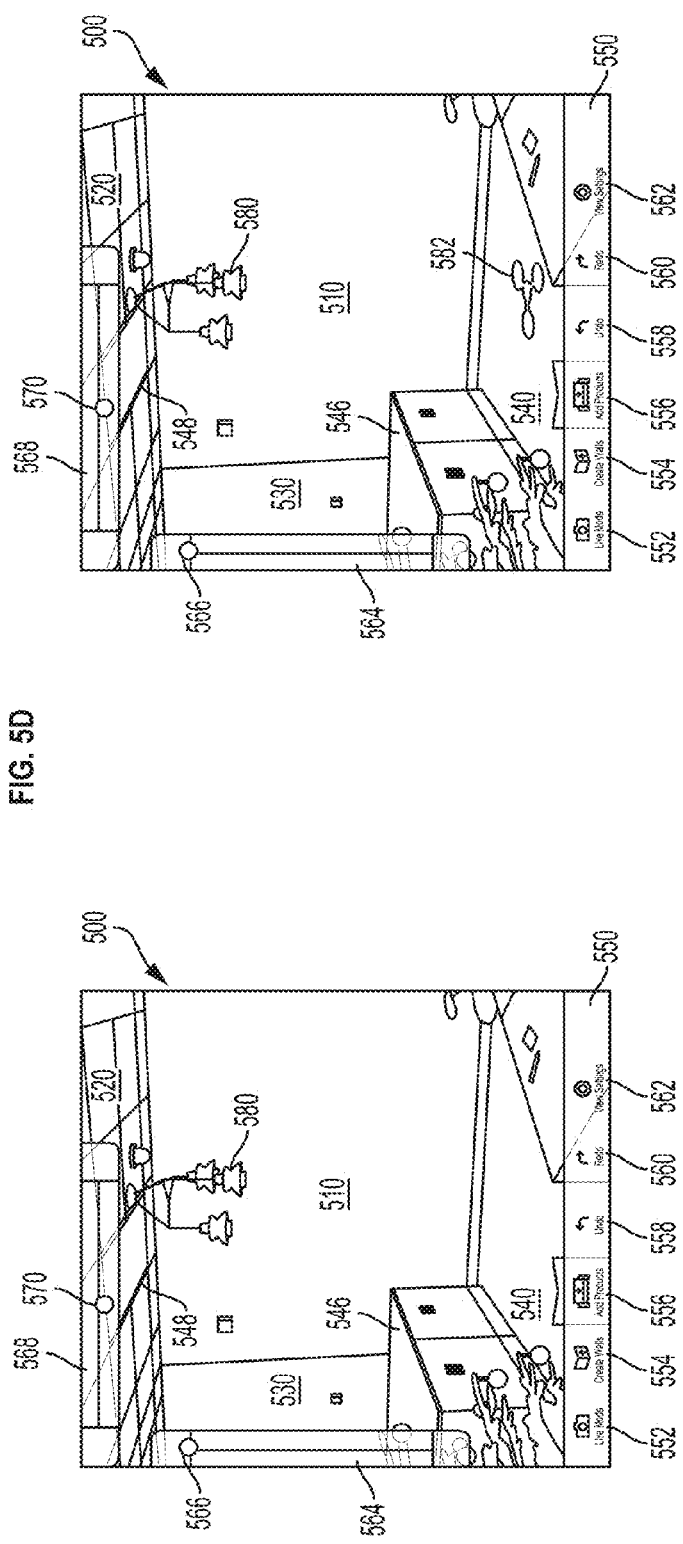
Figure 5E:
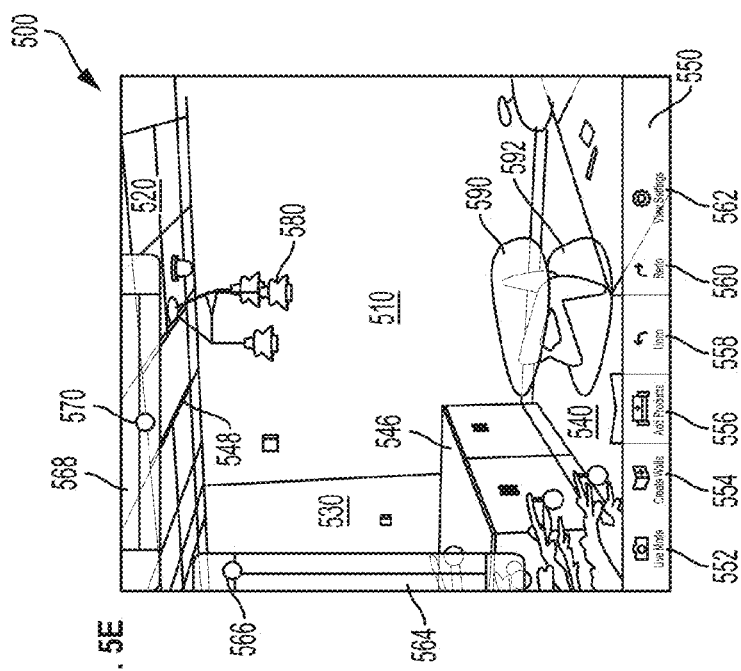
FIGS. 5E and 5F are further example representations of the 2D environment illustrated in FIGS. 5A and 5B.
Figure 5F:
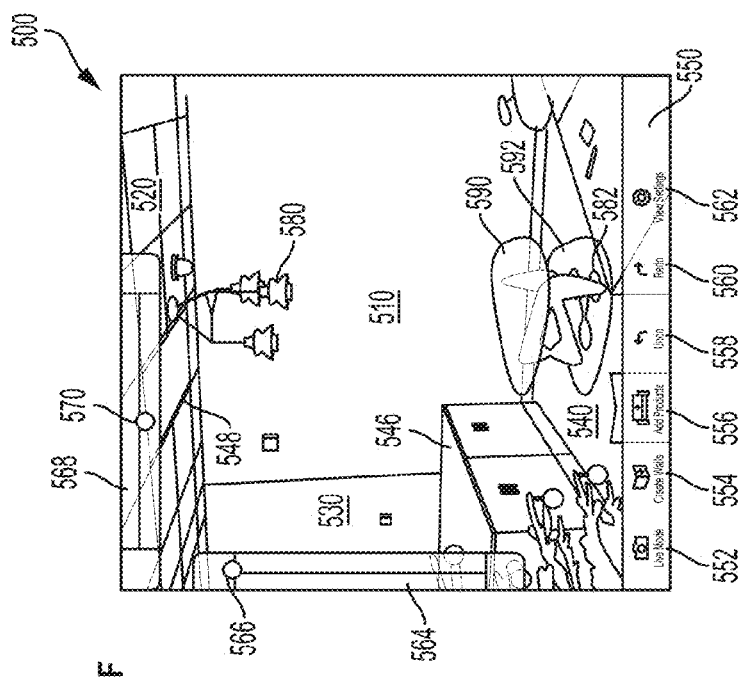

FIG. 1A is a block diagram illustrating the overall system for visualization of 3D models of objects in a 2D environment, in accordance with various embodiments of the present application. FIG. 1B is a schematic illustration of a system for visualization of 3D models of objects in a 2D environment. FIG. 2 is a block diagram showing various modules of an engine for visualization of 3D models of objects in the 2D environment. FIGS. 3A and 3B are representative examples of moving a 3D object and projecting a projection of the 3D object in the 2D environment. FIG. 4 is an example flowchart for a method of placing the 3D object in the 2D environment. FIGS. 5A and 5B are representations of an example 2D environment with displayed 3D objects. FIGS. 5C and 5D are representations of the 2D environment illustrated in FIGS. 5A and 5B, displaying different 3D objects. FIGS. 5E and 5F are further representations of the 2D environment where 3D objects may be moved. FIG. 6 illustrates an example of a computer network system, in which various embodiments may be implemented.

FIG. 1A illustrates a block diagram of an overall system 100 for visualization of 3D objects in a 2D environment, in accordance with various embodiments of the present disclosure. Overall system 100 may include a user 120, user devices 130, a user interface 140, an engine 200 for virtual visualization of 3D models of objects in 2D environment, a network 202, and various web applications 204. The user devices 130 may include a mobile phone 132, a personal computer (PC) 134, a personal digital assistant (PDA) 136, a tablet PC 137, a wearable computer device 138 such as Google Glass™ and Recon Jet™, a 3D scanner 139 and such other devices. The user 120 via user devices 130 interacts with the user interface 140. The user may also directly interact with the user interface via touchscreen, keyboard, mouse key, touch pad and the like. The engine 200 for visualization of 3D objects in 2D environment may comprise of local device-based, network-based, or web-based service available on any of the user devices 130. The user may further interact with the web applications 204. The web applications may include social networking services.

The user 120 may interact with the user interface 140 via the user devices 130. The system for virtual visualization of 3D models of objects in 2D environment 300 may be implemented on a local device or via a network-based or web-based service accessible via user devices 130. The user 120 may periodically interact with the system for virtual visualization of 3D models of objects in 2D environment 300 via the user interface 140 displayed using one of the user devices 130. Additionally, the user 120 may periodically interact with the web application 204 such as social networking service (including social networks, microblogs, web blogs, and other web resources) via the system for virtual visualization of 3D models of objects in 2D environment 300 and the network 110 to upload graphics obtained using the system for virtual visualization of 3D models of objects in 2D environment 300, communicate with members of the social networking service, or request help from design services, or purchase a 3D object through web applications 204.

The user devices 130, in some example embodiments, may include a Graphical User Interface (GUI) for displaying the user interface 140. In a typical GUI, instead of offering only text menus or requiring typed commands, the system 200 may present graphical icons, visual indicators, or graphical elements called widgets that may be utilized to allow the user 120 to interact with the user interface 140. The user devices 130 may be configured to utilize icons in conjunction with text, labels, or text navigation to fully represent the information and actions available to users.

The network 202 may include the Internet or any other network capable of communicating data between devices. Suitable networks may include or interface with one or more of, for instance, a local intranet, a Personal Area Network (PAN), a Local Area Network (LAN), a Wide Area Network (WAN), a Metropolitan Area Network (MAN), a virtual private network (VPN), a storage area network (SAN), an Advanced Intelligent Network (AIN) connection, a synchronous optical network (SONET) connection, Digital Subscriber Line (DSL) connection, an Ethernet connection, an Integrated Services Digital Network (ISDN) line, a cable modem, an Asynchronous Transfer Mode (ATM) connection, or an Fiber Distributed Data Interface (FDDI) or Copper Distributed Data Interface (CDDI) connection. Furthermore, communications may also include links to any of a variety of wireless networks, including Wireless Application Protocol (WAP), General Packet Radio Service (GPRS), Global System for Mobile Communication (GSM), Code Division Multiple Access (CDMA) or Time Division Multiple Access (TDMA), cellular phone networks, Global Positioning System (GPS), Cellular Digital Packet Data (CDPD), Research in Motion (RIM), limited duplex paging network, Bluetooth radio, or an IEEE 802.11-based radio frequency network. The network 202 may further include or interface with any one or more of an RS-232 serial connection, an IEEE-1394 (Firewire) connection, a Fiber Channel connection, an IrDA (infrared) port, a Small Computer Systems Interface (SCSI) connection, a Universal Serial Bus (USB) connection or other wired or wireless, digital or analog interface or connection, mesh. The network 202 may be a network of data processing nodes that are interconnected for the purpose of data communication.

FIG. 1B is a schematic illustration of an example system for visualization of 3D models of objects in a 2D environment. Specifically, as shown and described in more detail herein, a 2D environment may be provided including a 2D image 260. The 2D image 260 may be a photograph, line drawing or video. For example, the 2D image 260 may be a picture of a room or part of a room. The 2D image 260 may be a personalized image captured by a user's hand-held device or other computing device. In other examples, the 2D image 260 may be saved or imported from a storage device on a remote server or other device.

Perspective and scale may be added to the 2D image 260. The perspective and scale may be saved as part of the image such that the 2D image is now a combined image having both the 2D information and perspective and scale information associated with the 2D image.

A 3D object may then be positioned within the 2D image with perspective and scale overlay 262. The 3D object may be realistically positioned within the resulting image 264 based on the perspective and scale overlay information Perspective and scale may be added to the 2D image 260. The perspective and scale may be saved as part of the image such that the 2D image is now a combined image 262 having both the 2D information and perspective and scale information associated with the 2D image.

In some examples and as described in more detail herein, walls may be selectively positioned within the image. Further, in some examples, a 3D object may then be positioned within the 2D image with perspective and scale overlay, combined image 262. The 3D object may be realistically positioned within the resulting image 264 based on the perspective and scale overlay information. Further, the 3D object may be positioned within resulting image 264 such that the 3D object may be perceived in three dimensions within the 2D environment.

Perspective and scale may be added to the 2D image 260. The perspective and scale may be saved as part of the image such that the 2D image is now a combined image 262 having both the 2D information and perspective and scale information associated with the 2D image.

In some examples and as described in more detail herein, walls may be selectively positioned within the image. Further, in some examples, a 3D object may then be positioned within the 2D image with perspective and scale overlay, combined image 262. The 3D object may be realistically positioned within the resulting image 264 based on the perspective and scale overlay information. Further, the 3D object may be positioned within resulting image 264 such that the 3D object may be perceived in three dimensions within the 2D environment.

FIG. 2 illustrates a block diagram for the engine for virtual visualization of 3D models of objects in 2D environment 300. The engine for virtual visualization of 3D models of objects in 2D environment 300 may include a receiving module 206, an importing module 208, a visualizing module 210, an adding scale and perspective module 211, a superimposing module 212, an object replacing module 214, a moving module 216, a modify object module 217, a spinning module 218, a saving module 224, an uploading module 226 and a purchasing module 228.

Although various modules of the engine for visualization of 3D models of objects in 2D environment 300 are shown together, the engine for visualization of 3D models of objects in 2D environment 300 may be implemented as a web service, via a distributed architecture, or within a cloud computing environment. The files created with this application may contain perspective, scale and 3D model information in addition to the 2D graphic background information.

The files may be shared, or sent to, or opened on any user devices which may be configured to display these files.

The receiving module 206 may be configured to receive inputs from the user 120 regarding an import request. The import requests may include user-specified data regarding a 2D environment, such that the 2D environment may be used as a background environment for displaying one or more 3D models of objects. The importing module 208 may be configured to import the 2D environment. The 2D environment may be a 2D photograph of an interior space such as a living room, or a bedroom, or a kitchen space, or a bathroom, or a garage, or an office space, and such others. Additionally, the 2D environment may include existing graphical materials or graphical materials captured as a still image or a live feed image.

The visualizing module 210 may help the user 120 to visualize the imported 2D environment. The visualizing module 210 may be configured to receive a superimposing request from the user 120. The superimposing request may include a set of object information data related to a 3D object.

The user 120 may select the 3D object from a library of 3D objects or from 3D objects imported or saved by the user, which the user may have customized or made changes to using modify object module 217. The received superimposing request is passed to the superimposing module 212, which superimposes the selected 3D object, based on the superimposing request onto the 2D environment.

A non-limiting example of a 3D object may be a display. The display may be any of a television, monitor, computer monitor, or visual array including, but not limited to, a liquid crystal display (LCD), light emitting diode (LED) display, organic light emitting diode (OLED) display, cathode based display, or any other display device capable of providing a visual image to a viewer. The display may be comprise any of a plurality of shapes, such as square, rectangular, curved, round, or any suitable geometric shape. Further, the display may include a support frame, may be frameless, or any other structural form factor known in the art. The display may be a stand-alone display or one of a plurality of display units comprising a composite display including multiple display units.

In addition, the visualizing module 210 may be further configured to receive a request for object replacement from the user. The object replacement request may include object information data or metadata encoding object information data including dimensions, or color, or material type of the 3D object selected from the library of 3D objects. The received object replacement request is passed to the object replacing module 214, which changes the object, based on the request. Additionally, the selected 3D object may be replaced by the user 120 with another 3D object. For example, the user may replace a large chair with a small chair in a 2D environment after visualizing both the large chair and the small chair in the 2D environment.

The visualizing module 210 may further help the user 120 to alter view settings such as brightness or contrast of the imported 2D environment. Altering the brightness or contrast of the 2D environment may allow the user to visualize the positioning of the 3D object in the 2D environment under more light or less light situations. For example, the user may be able to visualize and appreciate how the 3D object superimposed on the 2D environment may look during day time versus night time conditions, or conditions of bright lighting or dim lighting where a lamp or light fixture is being used. Additionally, the visualizing module 210 may also help the user with directional options, such as a compass or a north facing arrow to identify the orientation of the 2D environment. The user may prefer to have directional options for personal reasons, or aesthetic preference, or for daylight requirement needs.

The visualizing module 210 may be further configured to receive scale data (defining the scale of the 2D environment) and the perspective data (defining the perspective of the 2D environment) request from the user. The scale data and perspective data request is passed on to the adding scale and perspective module 211, which allows the user to adjust the scale and perspective of the 2D environment.

The method then moves on to the moving module 216. The moving module 216 may be configured to receive an object spinning request for rotational movement of the 3D object imported on to the 2D environment. The spinning request thus received is passed on to the spinning module 218, which allows spinning or any such rotational movement of the 3D object in the 2D environment. For example, the 3D object inserted onto the 2D environment might be a chair or triangular table, and the user may prefer to precisely orient the chair seat in a particular direction or in case of the triangular table, the user may prefer to have the three corners of the table orient in a certain preferred directions.

As the user finalizes the appropriate color, material, positioning and spinning of the selected 3D object within the 2D environment, the resulting image may be uploaded to a social network website, microblogging service, blog or any other website resources by the uploading module 226. Thereby, the user 120 may receive inputs from contacts such as family members or friends regarding the resulting image formed by the 3D object placement in the 2D environment. With appropriate inputs, the user 120 may choose to alter the resulting image of the 3D object in the 2D environment. In addition, based on user request, the saving module 224 may save the resulting image for future use or reference. Alternatively, the user 120 may be highly satisfied with the overall look of the 3D object in the 2D environment and decide to purchase the 3D object. In such a situation the purchasing request is passed to the purchasing module, 228. In some embodiments, a contact of the user 120 via social networking websites in the web application 204, may request the user to purchase the 3D object in consideration.

Turning now to FIGS. 3A and 3B. FIG. 3A illustrates an example 2D environment 300. The example 2D environment 300 may include an interior space bounded by a wall 304, a wall 306 and a ground plane 302 (e.g. a floor surface). A mirror 332 may be present as part of the 2D environment. Further, the example 2D environment may comprise 3D models of objects such as a table 334 and a display 324.

FIG. 3A further includes a library 320. The library 320 may include various 3D objects that may be imported onto the 2D environment 300. As shown in FIGS. 3A and 3B, the library includes a couch 322, a table 330, a step stool 326, a table 334, a small drawer 328, a chest of drawers 336, and the display 324. The library 320 may include but not restricted to the 3D models of objects illustrated. As the 3D object is selected, a menu bar may be displayed indicating which plane the object may belong to, whether the object selected is a floor object, a wall object or a ceiling object. Further, the floor outline may be highlighted if the user selects a floor object such as a table, or the walls may be highlighted if the user selects a wall object, such as a mirror. A finger icon 350 or other suitable indicator may be used to select a 3D model from the library 320 and drag it to the room 300. Alternatively, the user may use key board, or touch pad, or mouse key on one of the user devices 130, to select and drag 3D objects onto the 2D environment 300.

The table 334 is placed on the ground plane 302 of the 2D environment 300 and the display 324, on the wall 306.

The table 334 may be further moved up or down, or sideways, or rotated along an axis or along multiple axes and adjusted in the 2D environment 300. Further the 3D model objects may be positioned one on top of the other. For example, the user may consider purchasing a vase or a table lamp for the 2D environment 300. In such cases, he may select the additional 3D objects and position them in a way that is practically and aesthetically satisfactory. If the user is not satisfied with the placement of the 3D object, the user has the option of deselecting or removing his selection of the 3D object.

Additionally, the finger icon 350 or other suitable indicator may be used to move the table 334. As shown in FIG. 3A, the finger icon 350 or other suitable indicator is being used to move the table 334 in an upward direction. Such movement of 3D objects by the finger icon or other suitable indicator can be executed along the X and Y plane of the 2D environment 300.

In order to align and position objects in the 2D environment, each object may comprise an associated projection. As illustrated in FIG. 3B, as the table 334 is moved upwards, a projection 335 of the table 334 is made on the horizontal plane, in this case, the ground plane 302. The projection 335 may be displayed as a shadow-like image of the 3D object or a portion of the object or a footprint of the object. As demonstrated in FIG. 3B, the projection may comprise of a planar target, including one or more of a shaded region 335, a pair of crosshairs 338 or a dashed outline 340 of the object or any other shadow or projection indicator to identify position of the object in the room. The user may have the option of selecting and displaying one or more of the projection possibilities. If necessary, the user may choose to display one or a subset of the shaded region 335, the pair of cross hairs 338, and the dashed outline 340.

The projection 335 may be displayed from the object onto any suitable surface. In FIG. 3A, the projection 335 is shown to be on the ground plane. Alternatively, the projection could be on an inclined plane, a curved surface, a vertical plane and the like. In FIG. 3B, the projection may be displayed as projection 335 on the ground plane 302 or floor, as projection 342 on wall 304 and projection 344 on wall 306. In some examples, the projection may be shown on a ceiling.

The projection may be generated on one or more planes of the two-dimensional environment as follows. For example, for a projection in the form of an outline of an object, the projection may be projected upon a plane according to the relationship of the 3D object and the angle of the plane. For each point of the 3D object, the corresponding point within the projection may be located on the plane such that a line perpendicular to the surface of the plane may connect the point of the projection and the corresponding point within the 3D object. Therefore, the location of the projection of the 3D object on the surface of the plane is determined by the angle of the surface of the plane relative to the location of the 3D object.

For example, as illustrated in FIG. 3A, projection 334 may be projected onto wall 306 in substantially the same size and orientation as table 334 due to the angle between table 334 and the surface of wall 306 being essentially 90 degrees. In contrast, projection 342 may be of a different size and orientation to table 334. The differences between the orientation and the size and orientation of projection 344 and 342 may be due the angle between table 334 and the surface of wall 304 being some angle other than 90 degrees. As the both projections 342 and 344 are projected by lines perpendicular to the surface of their respective walls, the observed differences in orientation and size of the projections may be calculated from the angle of the surface of the respective wall.

In some example embodiments, the projection may be represented as crosshairs 338, and the crosshairs 338 may be positioned at the center of the projection 335 of the 3D object, as shown in the example of FIG. 3B for the table 334. The identification of the central position of the projection helps the user to position other 3D objects under or above the table 334. For example, if the user would like to place a rug underneath the table 334, the user may select the crosshairs 338 to use as a center marking for placing the rug.

In some example embodiments, where the projection may be a dashed outline of the 3D object selected, the dashed outline 340 may be used as guide to place additional 3D objects adjacent to or in the vicinity of the selected 3D object. For example, in FIG. 3B, with the aid of the projection 335 of the table 334, the user may decide to add the couch 322 to the 2D environment 300. The user may use the dashed outline 340 as a guide to avoid collision of the table 334 and the couch 322 placed next to each other. The dashed outline line 340 thereby allows the user to foresee and prevent overcrowding and collision of objects placed near each other. This has the potential advantage of practically and precisely positioning one or more selected 3D objects in the 2D environment.

Figure 3C:
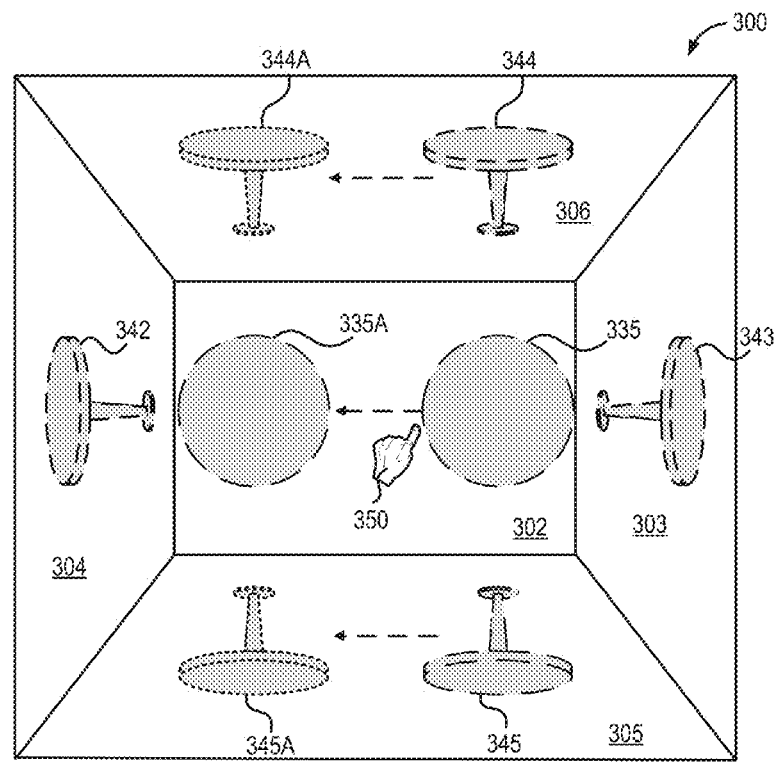

In some embodiments, projections of the 3D object may be used to move an object within the 2D environment. For example, FIG. 3C illustrates a top view of 2D environment 300. Projection 335 on ground plane 302, projection 344 on wall 306, and projection 345 on wall 305 are projections of the 3D object at a first position. Projection 335A on ground plane 302, projection 344A on wall 306, and projection 345A on wall 305 are projections of the 3D object at a second position. A user may drag the 3D object with finger icon 350 or other suitable indicator from the first position to the second position. Each projection may translate to the second position in proportion to the motion. It will be appreciated that, as the requested movement may not change the position of projection 335 relative to projections 342 on wall 304 and projection 343 on wall 303, projections 342 and 343 may not move relative to their respective wall surfaces.

In some embodiments, the models of the 3D objects may include metadata defining a spatial requirement, or minimum space required for the 3D object. For example, in public spaces, government regulations are in place defining spatial requirements for objects such as chairs, tables, etc., to ensure safe and convenient access within the space, such as local fire ordinances and the Americans with Disabilities Act, for example. In other applications, the spatial requirements may be provided for safe operation of equipment (e.g., a metal free space surrounding a magnetic resonance imager). These spatial requirements may directly affect the planning and efficient use of space.

Figure 3D:
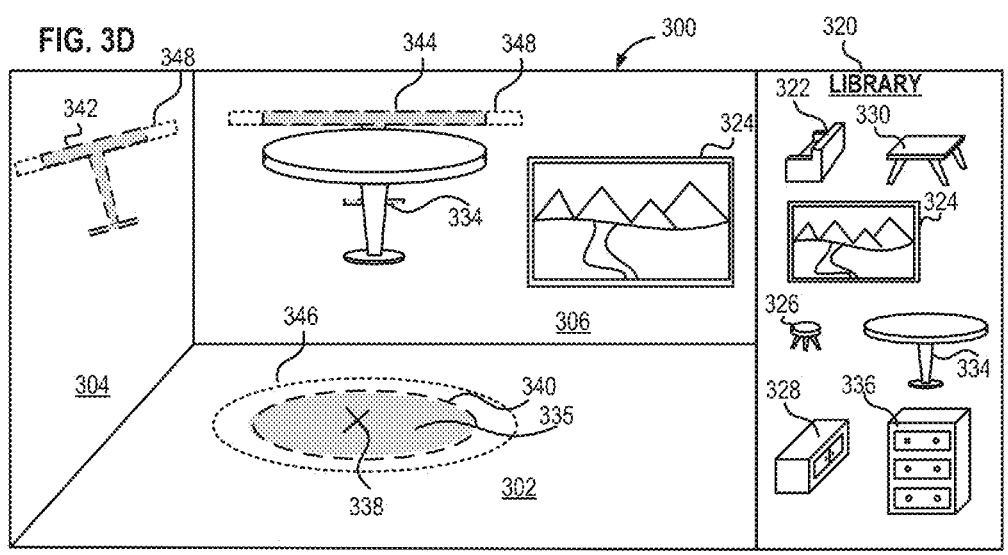

FIG. 3D illustrates moving a 3D object within a 2D environment where the 3D object includes a spatial requirement. Upon selection of the table 334, projections 335, 340, 338, 342, and 344 may be projected on their respective planar surfaces of the 2D environment as configured by the user. Additionally, the spatial requirement associated with the table may also be projected as spatial requirement floor projection 346, and spatial requirement wall projection 348. The visualization of the spatial requirement may allow the user to position table 334 within the 2D environment such that both the physical dimension requirements and the spatial requirement of table 334 are met. Like the projections of table 334, the spatial requirement may be visualized when table 334 is actively selected by the user. The method of managing 3D objects including spatial requirements within a 2D environment will be discussed in further detail with reference to FIG. 6 below.

FIG. 4 illustrates an example flow chart of a method 400 for positioning and aligning 3D objects in 2D environment. The method 400 may be performed by processing logic that may comprise hardware (e.g., programmable logic, microcode, and so forth), software (such as computer code executable on a general-purpose computer system or a specifically configured computer system), or a combination of both. The processing logic resides at the engine 200 for virtual visualization of 3D models of objects in 2D environment, as illustrated in FIG. 2. The method 400 may be performed by the various modules discussed above with reference to FIG. 2. Each of these modules may comprise processing logic.

Method 400 begins at 408 where the user 120 may obtain a 2D environment according to an import request. Then the receiving module 206 may receive, from the user, scale and perspective data on ground plane at operation 410. Similarly, the receiving module 206 may receive, from the user, scale and perspective data on ceiling height at operation 412. The user may define the ceiling and ground plane by selecting points on the 2D environment.

Method 400 continues at 420, for positioning 3D models of objects. At operation 422, the receiving module 206 may receive a request to superimpose 3D models of objects onto the 2D environment. A superimposing request may include a user selecting a 3D object from a library of 3D models of objects (in the engine for virtual visualization of 3D models of objects in 2D environment 300), from 3D models of objects saved or imported by the user, or 3D models of objects obtained from online resources.

At operation 424, the selected 3D model of the object may be superimposed on the 2D environment relative to the scale and perspective of the 2D environment defined in operations 410 and 412. As discussed above in reference to FIG. 2, the moving module 216 may receive a request to move the 3D objects in the 2D environment. The request to move or reposition the 3D objects may include data on the selection of a direction by the user. As examples, the 3D objects may be moved in a vertical and/or horizontal direction. As another example, the 3D object may be rotated about a vertical, horizontal, and/or other rotational axis.

At operation 426, during positioning of a 3D object in the 2D environment, a projection of the 3D object may be formed on a surface in the 2D environment. The surface may be selectable by the user, and may include a planar surface, or an inclined plane, or a curved surface. The projection of the 3D object allows the user to align the 3D object relative to other 3D objects and/or surfaces in the 2D environment. For example, if the user decides to add a chair to the 2D environment, the user may use the projection of the chair to visualize if the chair is being positioned in a practically convenient manner with respect to a work desk already present in the 2D environment. In another example, the user may decide to add a coffee table on rug already present in the 2D environment. The user may conveniently use projection of the coffee table as a guide to align the coffee table at the center of the rug. At this step, the visualizing module 210 may receive a request from the user for projecting the projection of the 3D model onto the 2D environment and may be configured to render a display of the projection to the user.

At operation 428, if the user is not satisfied with location of 3D object and/or its corresponding projection, then the user may move the 3D object along a horizontal plane, a vertical plane or a combination of both. Additionally, the user may also move the 3D object in a rotational manner for desired alignment, or replace the 3D object with another 3D object for aesthetic or practical preferences. If the user is satisfied with the location of the projection, the method 400 proceeds to operation 430.

At operation 430, the user may place additional 3D objects in the 2D environment. For example, the user may decide to place a light fixture at the top plane (e.g., ceiling plane) of the 2D environment and additionally place a coffee table underneath the light fixture. The user may use the projection of the light fixture on the ground plane as a target or guide to position the coffee table. In another example, the user may decide to place a chair and additionally place a chair mat under the chair. In such an example, the user may first add the chair to the 2D environment, then move it up along a vertical plane, and use the projection of the chair on the ground plane to align and position the chair mat. This way, the projection may have the potential advantage of moving, aligning and positioning 3D objects in the 2D environment in a practical and aesthetically pleasing manner. If the user is not satisfied with the positioning of the additional 3D object in the 2D environment, then the method 400 returns to operation 424. At operation 424, as discussed above, the user may continue repositioning the additional 3D object relative to the scale and perspective of the 2D environment.

FIGS. 5A and 5B illustrate another example 2D environment 500. The example 2D environment 500 may include an interior space bounded by walls 510 and 530, a ground plane 540 (e.g. a floor surface) and a top plane 520 (e.g. a ceiling surface). The 2D environment 500 includes various objects, such as, a chair 542, a floor cabinet 546 and a light source 548. The floor cabinet 546 and the light source 548 may be configured to be part of the 2D environment. The chair 542 is a 3D object that was selected from a library of 3D objects, similar to the library 320 discussed in FIG. 3A. The chair 542 may be moved in the 2D environment 500, in a vertical manner, or horizontal manner, or rotational manner, or the like. For example, when the chair 542 is moved in a vertical manner as shown in FIG. 5B, a projection 544 may be seen on the ground plane 540. The projection serves as a guide along a plane to position the 3D object. Alternatively, the projection may serve as a target to guide the user 120 for positioning the 3D object. Additionally, it allows the user 120 to decide if the chair 542 is aligned to the floor cabinet 546 in a desired manner or not.

FIGS. 5A and 5B further include a menu bar 550 positioned at a periphery of the display. The menu bar 550 may aid a user to access various functions for customizing the 2D environment. In the example menu bar 550 shown in FIG. 5A, a first virtual button 552, a second virtual button 554, a third virtual button 556, a fourth virtual button 558, a fifth virtual button 560 and a sixth virtual button 562 are presented along the menu options in the menu bar 550. The first virtual button 552, which is labeled "Live Mode," may be selected by the user 120 to visualize a 2D environment with any of the user devices 130, discussed above. The "Live Mode" button allows the user 120 to visualize a live video stream of the 2D environment. The user may add scale and perspective to the 2D environment wherein the 2D environment may be a photograph or a live video, and so forth.

The second virtual button 554, which is labeled "Create Walls," may be selected by the user 120 to add scale and perspective to the 2D environment. The user 120 may form walls by selecting intersection points and intersection lines between different planes of the 2D environment. The plane may be a wall plane, or a ground plane (e.g., a floor), or a ceiling plane, and so forth. The third virtual button 556, which is labeled "Add Products," may be selected by the user 120 to add 3D objects to the 2D environment 500. These 3D objects may be obtained by the user 120 from the network 202 or from information sharing via social networking in the web applications 204. In one example, the user may select one or more 3D objects from a catalog of 3D objects from multiple vendors and 3D object sources to display in the 2D environment. The fourth virtual button 558, which is labeled "Undo," may be selected by the user 120 to undo a prior modification of the selected 3D objects, or a most recent selection of the 3D object. With respect to the example illustrated in FIGS. 5A and 5B, if the user 120 is not satisfied with the positioning of the chair 542 and the alignment of the chair 542 with respect to the floor cabinet 546, the user 120 may undo the vertical movement of the chair 542, as shown in the FIG. 5B, and move the chair 542 in a horizontal direction and then in a vertical direction in order to achieve desired positioning. The fifth virtual button 560, which is labeled "Redo," may be selected by the user 120 to redo a movement of the 3D object that was recently performed. For example, if the user 120 is not satisfied with the positioning of the chair 542 as shown in FIGS. 5A and 5B, the user may undo the current positioning with the undo button, fourth virtual button 558 and may position the chair closer to the floor cabinet 546; however if the new position of the chair 542 is not satisfactory, then the user 120 may go back to the first positioning of the chair 542 using the redo button, fifth virtual button 560. Furthermore, the user 120 may save and share screenshots of the chair positioning with contacts such as family members or friends via the web applications 204 to seek their opinion. If one or more of the contacts share their opinion that the first position of the chair 542 was more aesthetically and practically satisfactory compared to the second (current) positioning of the chair 542, the user 120 may use the redo button, fifth virtual button 560 to return to the first positioning of the chair.

The sixth virtual button 562, which is labeled "View Settings," may be selected by the user 120 to review the settings of the 2D environment, in this example, 2D environment 500. For instance, the user 120 may not be satisfied with the brightness of the 2D environment 500 and hence would prefer to adjust the brightness, or the user 120 may not be satisfied with the color contrast of the room and would prefer to adjust the contrast settings. Additionally, the View Settings button, sixth virtual button 562 may provide the option of direction via a compass or a north pointing directional arrow. This may aid the user 120 in placing 3D objects in a particular preferred direction. Several users may have directional preference for placing of objects with respect to object material type and color and the directional aspect is hence very useful for such purposes.

Still further FIG. 5A includes a vertical moving means 564. The vertical moving means 564 may be used to position a selected 3D object in the 2D environment 500. In FIGS. 5A and 5B, the selected 3D object is the chair 542. The vertical moving means may include a vertical virtual slider icon 566. The vertical virtual slider icon 566 may be moved along the vertical moving means 564. Alternatively, the vertical moving means 564, may be a slider or a scroll bar, or the like. The vertical virtual slider icon 566 may be moved along the vertical moving means 564 by the user 120 using a finger on the screen of one or more of the client devices or user devices 130. Alternatively, the user 120 may use a mouse in one of the user devices 130, or the user 120 may use the touch pad on any of the user devices 130 to move the vertical virtual slider icon 566.

Additionally, FIGS. 5A and 5B also include a horizontal moving means 568, with a horizontal virtual slider icon 570. The horizontal virtual slider icon 570 may be moved along the horizontal moving means 568. The horizontal virtual slider icon 570 may be configured to rotate or spin the selected 3D object. The lengths of the horizontal and vertical scroll bar are scaled to correspond to the horizontal and vertical dimensions, respectively, of the displayed 2D environment. Accordingly, centrally positioning the horizontal scroll bar may centrally position a selected 3D object in a horizontally central position of the 2D environment. For example, as shown in FIG. 5B, the chair 542 may be centrally positioned with respect to the horizontal dimension of the 2D environment by positioning the horizontal virtual slider icon 570 at a center of the horizontal moving means 568. In this way, 3D objects may be positioned, repositioned, and aligned relative to the 2D environment in a convenient, user-friendly, and expeditious manner. The horizontal slider icon 570 may be used to position selected 3D objects in the 2D environment 500, along the horizontal plane. The horizontal plane may be the ground plane (e.g. floor plane) 540 or the top plane (e.g. ceiling plane) 520, depending on whether the 3D object being moved is a floor object or a ceiling object. As discussed above regarding the vertical virtual slider icon 566 on the vertical moving means 564, the horizontal virtual slider icon 570 may be moved along the horizontal moving means 568 by the user using his finger or using a mouse or a touch pad in any of the user devices 130, discussed above.

FIGS. 5C and 5D illustrate 2D environment 500, with the chair 542 removed and a light fixture 580 superimposed on the 2D environment 500. The user may remove the chair 542 from the 2D environment by selecting the chair 542 with an input device such as a mouse key, keyboard, touch pad, or other input device of any of the user devices 130. Alternatively, the user may click or select the undo button, fourth virtual button 558 to undo the last action, in this case, adding the chair to the environment. The light fixture 580 may be selected from a library of 3D objects, and dragged onto the 2D environment 500. As the light fixture 580 may correspond to a ceiling object, in the 2D environment 500, the light fixture 580 may be positioned on the top plane 520. The user may use the horizontal moving means 568 and the horizontal virtual slider icon 570 to precisely position the light fixture 580. As illustrated in FIG. 5D, a projection 582 of the light fixture 580 may be seen on the ground plane 540. An advantage of the projection 582 is to serve as a guide for the user to position the light fixture 580 appropriately. The projection 582 is shown as a shadow, but may also be shown as cross hairs or as dashed outline of the light fixture. The cross hair representation of the light fixture projection may serve as a center point for placing additional objects. The dashed outline projection of the light fixture may be used as a guide to place additional objects underneath the light. Alternatively, if the user decides to add additional objects such as a chair, where he does not desire to have direct lighting from the light fixture, he may use the dashed outline to position the chair outside the realm of the dashed line. In FIG. 5D the vertical virtual slider icon 566 is shown to be at the topmost position on the vertical moving means 564. This position of the vertical virtual slider icon 566 indicates that the selected 3D object is at the topmost position or topmost level of the 2D environment 500; in the example of FIG. 5D, the topmost position is the ceiling or top plane 520.

If the user decides to superimpose an additional 3D object onto the 2D environment 500, then the user may select another 3D object from a library, similar to the library 320 illustrated in FIGS. 3A and 3B. The user may access the library by clicking on or selecting the Add Products button, third virtual button 556, on the menu bar 550. The user may use one or more of the input devices of user devices 130 to access the Add Products button, third virtual button 556. The additionally selected 3D object may then be superimposed on the 2D environment 500. In the example illustrated in FIGS. 5E and 5F, the additional 3D object superimposed on 2D environment 500 is a triangular table 590. Upon selection of triangular table 590, a triangular table projection 592 may be projected on the floor plane. The user may prefer to position the triangular table 590 with respect to the position of the light fixture 580. Such alignment may be facilitated using the projection of the light fixture 580 as a guide. As shown in FIG. 5F, the projection 582 of the light fixture 580 may serve as a center guide or target for positioning the triangular table 590. The projection 582 is shown as a shadow, but may also be represented as crosshairs or as a dashed outline. The user may use the cross hairs projection of the light fixture 580 as a center position guide to place the triangular table 590. The user may need to move or rotate the triangular table 590 such that the cross hairs projection of the light fixture may precisely pass through the center of the table 590. Alternatively, the user may prefer not to position the table 590 precisely beneath the light fixture 580. In such an example, the dashed outline projection of the light fixture 580 may serve as a guide to align the table 590 away from the projection 582.

In further examples, the user may decide to add a rug or a chair or such other 3D objects to the 2D environment 500. As described above, the user may engage the projection of the light fixture as a guide to align the additional 3D object, either to include the projection of the light fixture, or to avoid the projection from the light fixture.

Figure 3E:
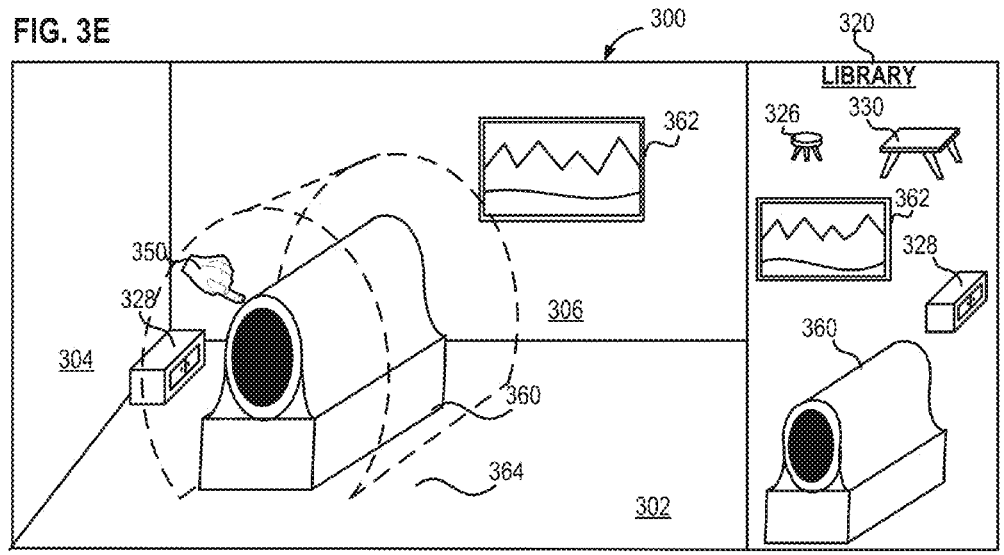
FIGS. 3E and 3F are example representations of a 2D environment with 3D objects.
Figure 3F:
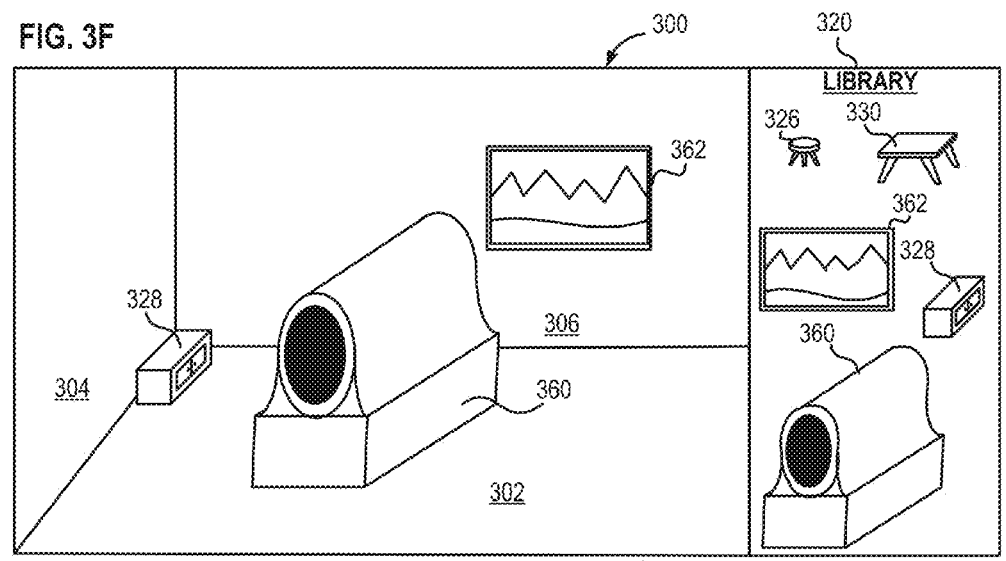

FIG. 6 illustrates an example flow chart of a method 600 for positioning and aligning 3D objects in 2D environment and will be discussed with reference to FIGS. 3E and 3F. The method 600 may be performed by processing logic that may comprise hardware (e.g., programmable logic, microcode, and so forth), software (such as computer code executable on a general-purpose computer system or a specifically configured computer system), or a combination of both. The processing logic resides at the engine 200 for virtual visualization of 3D models of objects in 2D environment, as illustrated in FIG. 2. The method 600 may be performed by the various modules discussed above with reference to FIG. 2. Each of these modules may comprise processing logic.

Method 600 begins at 608 where the user 120 may obtain a 2D environment according to an import request. Then the receiving module 206 may receive, from the user, scale and perspective data on ground plane at operation 610. Similarly, the receiving module 206 may receive, from the user, scale and perspective data on ceiling height at operation 612. The user may define the ceiling and ground plane by selecting points on the 2D environment.

Method 600 continues at 620, for positioning 3D models of objects. At operation 622, the receiving module 206 may receive a request to superimpose 3D models of objects onto the 2D environment. A superimposing request may include a user selecting a 3D object from a library of 3D models of objects (in the engine for virtual visualization of 3D models of objects in 2D environment 300), from 3D models of objects saved or imported by the user, or 3D models of objects obtained from online resources.

At operation 624, the selected 3D model of the object may be superimposed on the 2D environment relative to the scale and perspective of the 2D environment defined in operations 610 and 612. As discussed above in reference to FIG. 2, the moving module 616 may receive a request to move the 3D models in the two-dimensional environment. The request to move or reposition the 3D models may include data on the selection of a direction by the user. As examples, the 3D model may be moved in a vertical and/or horizontal direction. As another example, the 3D model may be rotated about a vertical, horizontal, and/or other rotational axis.

At operation 626, during positioning of a 3D model in the two-dimensional environment, a projection of the 3D model may be formed on a surface in the 2D environment. The surface may be selectable by the user, and may include a planar surface, or an inclined plane, or a curved surface. The projection of the 3D model allows the user to align the 3D model relative to other 3D models and/or surfaces in the two-dimensional environment. For example, as illustrated in FIGS. 3E and 3F, a user may select a magnetic resonance imager 360 from the menu and drag it onto the two dimensional environment. Upon selection of the magnetic resonance imager 360 as illustrated by finger icon 350 or other suitable indicator, method 600 may also proceed to operation 628 which includes projecting a spatial requirement 364 around magnetic resonance imager 360. The spatial requirement may be included in metadata included with the 3D model of magnetic resonance imager 360. Although spatial requirement 364 is illustrated as elliptical and extending the region of the two-dimensional environment occupied by magnetic resonance imager 360 beyond the physical dimensions of the magnetic resonance imager 360, in some embodiments, the spatial requirement may be projected in any two dimensional or three dimensional shape, such as a cube or sphere for example. The spatial requirement 364 may be visible as long as the magnetic resonance imager 360 is selected.

The user may conveniently use projections of the magnetic resonance imager 360 and the spatial requirement 364 to position the magnetic resonance imager 360 within two-dimensional environment 300 such that small drawer 328 and medical display 362 are outside of the spatial requirement 364. At this step, the visualizing module 210 may receive a request from the user for projecting the projection of the 3D model onto the two-dimensional environment and may be configured to render a display of the projection to the user.

Returning to FIG. 6, at operation 630, the visualizing module 210 may be configured to determine the spatial requirement of the 3D model. If the spatial requirement does not interact with other features of the two-dimensional environment or other 3D models and their respective spatial requirements within the two-dimensional environment, method 600 may proceed to operation 632. If the spatial requirement is not met, method 600 may return to operation 624 prompting the user to reposition the 3D object within the two-dimensional environment.

At operation 632, if the user is not satisfied with location of 3D object and/or its corresponding projection, then the user may move the 3D object along a horizontal plane, a vertical plane or a combination of both. Additionally, the user may also move the 3D object in a rotational manner for desired alignment, or replace the 3D object with another 3D object for aesthetic or practical preferences. The spinning module 218 of FIG. 2 may be further configured to move a projection of the 3D object in a rotational manner or rotating the projection about one or more axes of rotation.

As a non-limiting example, a user may select the chair causing a projection of the chair to be projected on a floor plan of the 2D environment with a central axis of rotation aligned with both the center of the chair and the center of the projection of the chair on the floor plane and perpendicular to the floor plane. The user may then rotate the chair around the central axis of rotation.

If the user is satisfied with the location of the projection, the method 600 proceeds to operation 634.

At operation 634, the user may place additional 3D objects in the 2D environment. For example, the user may decide to place additional medical equipment within the two-dimensional environment, then the method 600 returns to operation 624. At operation 624, as discussed above, the user may continue repositioning the additional 3D object relative to the scale and perspective of the 2D environment.

Figure 7:
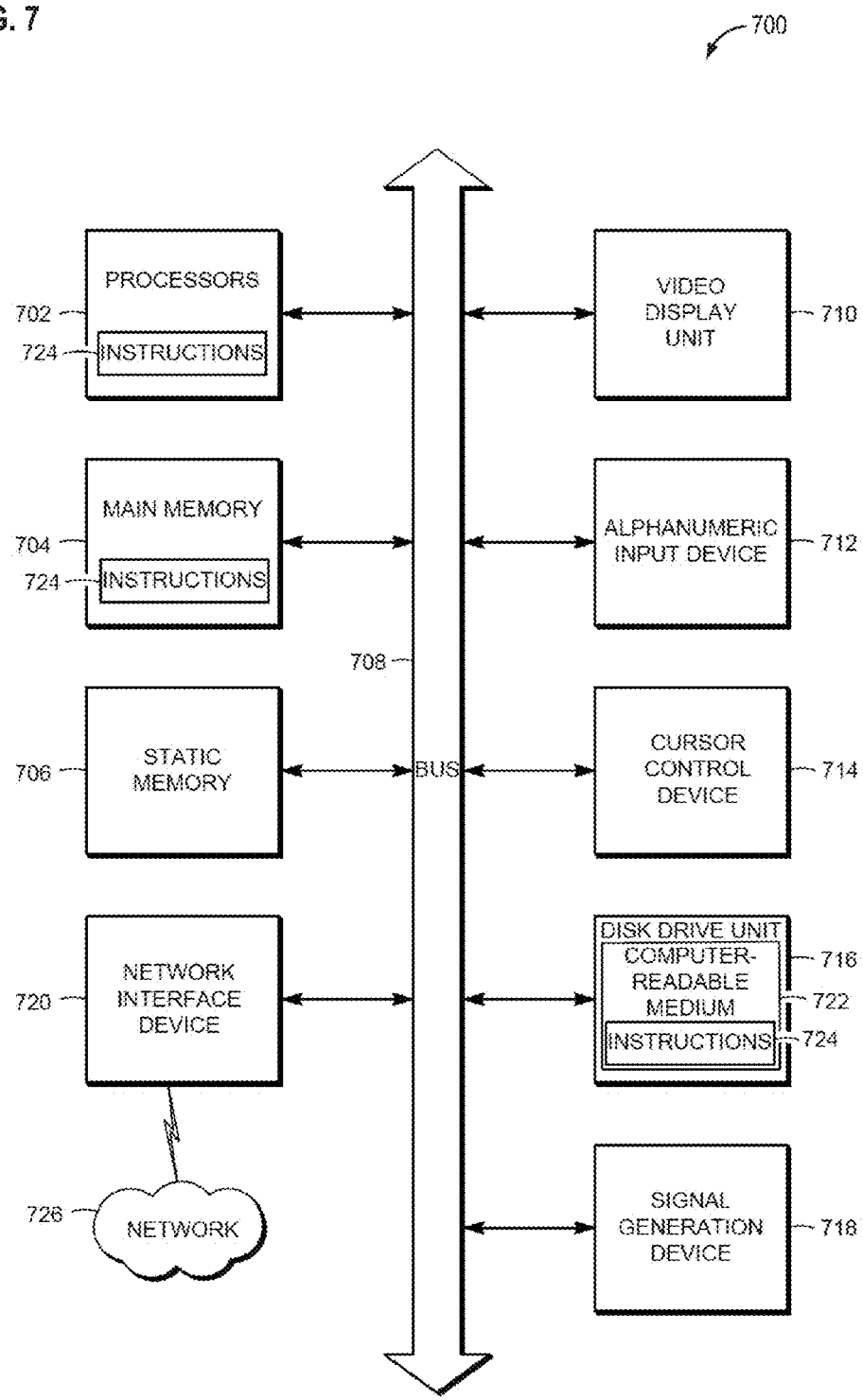
FIG. 7 illustrates an example of a computer network system, in which various embodiments may be implemented.

FIG. 7 shows an example electronic form of a computer system 700, within which is a set of instructions for causing a machine to perform any one or more of the methodologies discussed herein may be executed. The machine may be a PC, a tablet PC, a set-top box (STB), a PDA, a cellular telephone, a web appliance, a network router, switch or bridge, or any machine capable of executing a set of instructions (sequential or otherwise) that specify actions to be taken by that machine. In several example embodiments, the machine operates as a standalone device or may be connected to other machines (e.g., networked). In a networked disposition, the machine may operate in the capacity of a server or a client machine in a server-client network environment.

The example computer system 700 may be configured to include a processor or multiple processors 702 (e.g., a central processing unit (CPU), a graphics processing unit (GPU), or both), a main memory 704 and a static memory 706, which communicate with each other via a bus 708. The computer system 700 may further include a video display unit 710 (e.g., a liquid crystal display (LCD) or a cathode ray tube (CRT), and the like). The computer system 700 may also include an alphanumeric input device 712 (e.g., a keyboard, and the like), a cursor control device 714 (e.g., a mouse, touchpad, touchscreen, and the like), a disk drive unit 716 for reading computer readable medium (e.g., USB thumb drive, solid state memory drives, and the like), a signal generation device 718 (e.g., a speaker, and the like (e.g., network interface card, and the like), and a network interface device 720.

Further, the disk drive unit 716 may include a computer-readable medium 722, on which is stored one or more sets of instructions and data structures (such as instructions 724) embodying or utilized by any one or more of the methodologies or functions described herein. Additionally, the instructions 724 may also reside, completely or partially, within the main memory 704 and/or within the processors 702 during execution by the computer system 700. The main memory 704 and the processors 702 may also constitute machine-readable media. Further still, the instructions 724 may be transmitted or received over a network 726 via the network interface device 720 utilizing any one of a number of well-known transfer protocols (e.g., Hyper Text Transfer Protocol (HTTP)).

The computer-readable medium 722 may include a single medium or multiple media (e.g., a centralized or distributed database and/or associated caches and servers) that store the one or more sets of instructions. The term "computer-readable medium" may further include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. Further, "computer-readable medium" may further include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like.

It will be appreciated that the configurations and routines disclosed herein are exemplary in nature, and that these specific embodiments are not to be considered in a limiting sense, because numerous variations are possible. For example, the above technology can be applied to various 3D objects superimposed on various 2D environments. The subject matter of the present disclosure includes all novel and non-obvious combinations and sub-combinations of the various systems and configurations, and other features, functions, and/or properties disclosed herein.

The above-disclosed embodiments may be combined with one or more of the embodiments and disclosures in U.S. Provisional Patent Application No. 61/992,629 entitled "METHOD FOR PROVIDING SCALE TO ALIGN 3D OBJECTS IN 2D ENVIRONMENT" filed May 13, 2014, one or more of the embodiments and disclosures in U.S. Provisional Patent Application No. 61/992,759 entitled "METHOD FOR FORMING WALLS TO ALIGN 3D OBJECTS IN 2D ENVIRONMENT", filed on May 13, 2014, one or more of the embodiments and disclosures in U.S. Provisional Patent Application No. 61/992,774 entitled "METHOD FOR MOVING AND ALIGNING 3D OBJECTS IN A PLANE WITHIN THE 2D ENVIRONMENT", filed May 13, 2014, one or more of the embodiments and disclosures in U.S. Provisional Patent Application No. 61/992,746 entitled "METHOD FOR REPLACING 3D OBJECTS IN 2D ENVIRONMENT", filed May 13, 2014, and/or one or more of the embodiments and disclosures in U.S. Provisional Patent Application 61/992,665 entitled "METHOD FOR INTERACTIVE CATALOG FOR 3D OBJECTS WITHIN THE 2D ENVIRONMENT", filed May 13, 2014. The entire contents of each provisional application referenced herein are hereby incorporated by reference for all purposes. For example, and not as a limitation, the embodiments herein may be combined with the elements and features disclosed in Provisional Application No. 61/992,629, the embodiments herein may be combined with the elements and features disclosed in Provisional Application No. 61/992,759, in combination with one or more of the elements and features disclosed in Provisional Application No. 61/992,774, in combination with one or more of the elements and features disclosed in Provisional Application No. 61/992,746, and/or in combination with one or more of the elements and features disclosed in Provisional Application No. 61/992,665. These combinations may include one or more features disclosed in one or more of the referenced provisional applications, including combinations of embodiments disclosed herein with features shown in one, two, three, four, or five of the provisional applications.

Further, the entire contents of each concurrently filed application, U.S. Non-Provisional Patent Application No. entitled "METHOD FOR PROVIDING SCALE TO ALIGN 3D OBJECTS IN 2D ENVIRONMENT" filed May 12, 2015, U.S. Non-Provisional Patent Application No. entitled "METHOD FOR FORMING WALLS TO ALIGN 3D OBJECTS IN 2D ENVIRONMENT", filed on May 12, 2015, U.S. Non-Provisional Patent Application No. entitled "METHOD FOR MOVING AND ALIGNING 3D OBJECTS IN A PLANE WITHIN THE 2D ENVIRONMENT", filed May 12, 2015, U.S. Non-Provisional Patent Application No. entitled "METHOD FOR REPLACING 3D OBJECTS IN 2D ENVIRONMENT", filed May 12, 2015 and/or U.S. Non-Provisional Patent Application No. entitled "METHOD FOR INTERACTIVE CATALOG FOR 3D OBJECTS WITHIN THE 2D ENVIRONMENT", filed May 12, 2015, referenced herein are hereby incorporated by reference for all purposes.

The foregoing description is illustrative of particular embodiments of the invention, but is not meant to be a limitation upon the practice thereof.

The foregoing discussion should be understood as illustrative and should not be considered limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or steps plus function elements in the claims below are intended to include any structure, material or acts for performing the functions in combination with other claimed elements as specifically claimed.

Finally, it will be understood that the articles, systems, and methods described hereinabove are embodiments of this disclosure—non-limiting examples for which numerous variations and extensions are contemplated as well. Accordingly, this disclosure includes all novel and non-obvious combinations and sub-combinations of the articles, systems, and methods disclosed herein, as well as any and all equivalents thereof.

The invention claimed is:

1. A method for visualizing a three-dimensional model of an object in a two-dimensional environment, the method comprising:
   receiving, with a processor, from a user, an import request to import the two-dimensional environment to be used as a background for the three-dimensional model;
   importing, with the processor, based on the import request, the two-dimensional environment;
   receiving, with the processor, from the user, a superimposing request to superimpose the three-dimensional model of the object onto the two-dimensional environment;
   superimposing, with the processor, the three-dimensional model of the object onto the two-dimensional environment based on the superimposing request;
   superimposing, with the processor, a shadow of the three-dimensional model of the object onto one or more planes of the two-dimensional environment, the three-dimensional model positioned away from the one or more planes; and
   displaying, with the processor, the three-dimensional model of the object on the two-dimensional environment and the shadow on the one or more planes of the two-dimensional environment for guiding a positioning of the three-dimensional model of the object within the two-dimensional environment.

2. The method of claim 1, further comprising:
   superimposing the three-dimensional model of the object along a plane at a first position within the two-dimensional environment;
   moving the three-dimensional model of the object along an axis perpendicular to the plane; and
   projecting a planar target of the three-dimensional model of the object on the plane about the axis.

3. The method of claim 1, further comprising:
   selecting an alignment axis from a first three-dimensional model of an object;
   generating a planar projection along the alignment axis; and
   positioning a shadow of a second three-dimensional model of an object corresponding to the planar projection.

4. The method of claim 2, wherein moving the three-dimensional model of the object within the two-dimensional environment includes one or more of moving the three-dimensional model of the object in a vertical direction, a horizontal direction, and a rotational manner about an axis of the three-dimensional model of the object.

5. The method of claim 1, wherein superimposing the shadow of the three-dimensional model of the object onto the two-dimensional environment includes superimposing the shadow onto two or more of a horizontal plane, a vertical plane, an inclined plane, and a curved surface.

6. The method of claim 1, wherein the shadow is displayed as an outline of the three-dimensional model of the object.

7. The method of claim 6, wherein the shadow is displayed when the three-dimensional model is selected.

8. The method of claim 1, further comprising:
   receiving metadata from the three-dimensional model defining a spatial requirement, the spatial requirement corresponding to a region of the two-dimensional environment surrounding the three-dimensional model and extending a region of the two-dimensional environment occupied by the three-dimensional model beyond a physical dimension of the three-dimensional model; and
   projecting the spatial requirement onto the two-dimensional environment.

9. The method of claim 1, further comprising:
   determining a spatial requirement of the three-dimensional model;
   identifying an interaction of the spatial requirement with one or more of an object within the two-dimensional environment, an additional three-dimensional model superimposed onto the two-dimensional environment, a boundary of a plane of the two-dimensional environment, and an additional spatial requirement of the additional three-dimensional model; and
   if the interaction is not identified, a superimposing module is configured to superimpose the three-dimensional model onto the two-dimensional environment.

10. A system for visualization of a three-dimensional model of an object in a two-dimensional environment, the system comprising:
    a processor; and
    a storage device, the storage device containing instructions executable by the processor comprising:
       a receiving module configured to receive one or more requests from a user, the requests including one or more of an import request, a scale data request, a superimposing request, a selection of the three-dimensional model of the object, and a request for projection of the three-dimensional model of the object;

an importing module configured to import, based on the import request of the user, the two-dimensional environment;

a superimposing module configured to superimpose, based on the superimposing request, the three-dimensional model of the object onto the two-dimensional environment; and a visualizing module configured to render a display of a projection footprint of the three-dimensional model of the object on one or more planes within the two-dimensional environment based on the request for projection of the three-dimensional model of the object, the one or more planes positioned away from the three-dimensional model of the object, wherein a position of the projection footprint on the one or more planes indicates a position of the three-dimensional model of the object within the two-dimensional environment.

11. The system of claim 10, wherein the superimposing module is further configured to superimpose the three-dimensional model of the object along a plane at a first position within the two-dimensional environment;

a moving module is further configured to move the three-dimensional model of the object along an axis perpendicular to the plane; and the visualizing module is configured to, upon selection of the three-dimensional model of the object, project a planar target to the three-dimensional model of the object on the plane about the axis.

12. The system of claim 10, wherein the receiving module is configured to receive an input selecting an alignment axis from a first three-dimensional model of an object and an input selecting a second three-dimensional model of a second object; and the visualizing module is configured to generate a planar projection along the alignment axis, and position a projection of the second three-dimensional model of the second object corresponding to the planar projection.

13. The system of claim 11, wherein moving the three-dimensional model of the object within the two-dimensional environment includes one or more of moving the three-dimensional model of the object in a vertical direction, a horizontal direction, and a rotational manner about an axis of the three-dimensional model of the object.

14. The system of claim 10, wherein displaying the projection footprint of the three-dimensional model of the object on the two-dimensional environment includes displaying the projection footprint on two or more of a horizontal plane, a vertical plane, an inclined plane, and a curved surface.

15. The system of claim 10, wherein the projection footprint is displayed as a footprint image of the three-dimensional model of the object.

16. The system of claim 10, wherein the receiving module is configured to receive an input from the user selecting the three-dimensional model of the object; and the visualizing module is further configured to display the projection footprint of the three-dimensional model of the object.

17. The system of claim 10, wherein the visualizing module is further configured to:

receive metadata from the three-dimensional model defining a spatial requirement, the spatial requirement corresponding to a region of the two-dimensional environment surrounding the three-dimensional model and extending a region of the two-dimensional environment occupied by the three-dimensional model beyond a physical dimension of the three-dimensional model; and project the spatial requirement onto the two-dimensional environment.

18. The system of claim 17, wherein the visualizing module is further configured to:

determine the spatial requirement of the three-dimensional model;

identify an interaction of the spatial requirement with one or more of an object within the two-dimensional environment, an additional three-dimensional model superimposed onto the two-dimensional environment, and an additional spatial requirement of the additional three-dimensional model; and if the interaction is not identified, the superimposing module is configured to superimpose the three-dimensional model onto the two-dimensional environment.

19. A system for visualization of a three-dimensional model of an object in a two-dimensional environment, the system comprising:

a processor; and a storage device, the storage device containing instructions executable by the processor comprising:

a receiving module configured to receive one or more requests from a user, the requests including one or more of an import request, a scale data request, a superimposing request, a request for projection of the three-dimensional model of the object for guiding an alignment of the three-dimensional model of the object, and an input selecting an alignment axis from a first three-dimensional model of an object;

an importing module configured to import, based on the import request of the user, the two-dimensional environment;

a superimposing module configured to superimpose, based on the superimposing request, the three-dimensional model of the object onto the two-dimensional environment; and a visualizing module configured to render a display of a projection of the three-dimensional model of the object in the two-dimensional environment based on the request for projection of the three-dimensional model of the object, wherein, upon receiving the request for projection, the visualizing module is configured to:

receive metadata from the three-dimensional model defining a spatial requirement, the spatial requirement corresponding to a region of the two-dimensional environment surrounding the three-dimensional model and extending a region of the two-dimensional environment occupied by the three-dimensional model beyond a physical dimension of the three-dimensional model; and project the spatial requirement onto one or more planes within the two-dimensional environment, the one or more planes positioned away from the three-dimensional model of the object.

20. The system of claim 19, wherein the visualizing module is further configured to:

determine the spatial requirement of the three-dimensional model;

identify an interaction of the spatial requirement with one or more of an object within the two-dimensional environment, an additional three-dimensional model superimposed onto the two-dimensional environment, and an additional spatial requirement of the additional three-dimensional model; and if the interaction is not identified, the superimposing module is configured to superimpose the three-dimensional model onto the two-dimensional environment.

* * * * *